United States Patent
Tanaka et al.

(10) Patent No.: US 11,183,931 B2
(45) Date of Patent: Nov. 23, 2021

(54) POWER CONVERTER INCLUDING A FEEDBACK CONTROL SYSTEM

(71) Applicant: Mitsubishi Electric Corporation, Tokyo (JP)

(72) Inventors: Yuya Tanaka, Tokyo (JP); Akinu Nakabayashi, Tokyo (JP); Tomoyuki Taniguchi, Tokyo (JP); Shingo Kato, Tokyo (JP); Matahiko Ikeda, Tokyo (JP); Takashi Kaneyama, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/595,740

(22) Filed: Oct. 8, 2019

(65) Prior Publication Data

US 2020/0161971 A1    May 21, 2020

(30) Foreign Application Priority Data

Nov. 21, 2018    (JP) .............................. JP2018-217877

(51) Int. Cl.
```
H02M 3/157    (2006.01)
H02M 3/158    (2006.01)
H03K 7/08     (2006.01)
H02M 1/00     (2006.01)
```
(52) U.S. Cl.
CPC ........... *H02M 3/157* (2013.01); *H02M 3/158* (2013.01); *H03K 7/08* (2013.01); *H02M 1/0009* (2021.05); *H02M 1/0012* (2021.05); *H02M 1/0025* (2021.05)

(58) Field of Classification Search
CPC ................ H02M 3/157; H02M 3/158; H02M 2001/0009; H02M 2001/0012; H02M 2001/0025; H03K 7/08

USPC .......................................................... 323/283
See application file for complete search history.

(56) References Cited

U.S. PATENT DOCUMENTS

| | | | | |
|---|---|---|---|---|
| 5,793,623 A | * | 8/1998 | Kawashima | ........ H02M 1/4225 363/56.05 |
| 2004/0145338 A1 | * | 7/2004 | Nakamura | .............. B60L 50/61 318/801 |

FOREIGN PATENT DOCUMENTS

| | | |
|---|---|---|
| JP | 2003-036991 A | 2/2003 |
| JP | 2015-171312 A | 9/2015 |

OTHER PUBLICATIONS

Communication dated Nov. 19, 2019, from the Japanese Patent Office in Application No. 2018-217877.

\* cited by examiner

*Primary Examiner* — Shawki S Ismail
*Assistant Examiner* — Monica Mata
(74) *Attorney, Agent, or Firm* — Sughrue Mion, PLLC; Richard C. Turner

(57) ABSTRACT

To provide a power converter which can maintain the stability and the response of the feedback control system, even if the frequency characteristic of the chopper circuit changes according to change of driving condition. A power converter is provided with a chopper circuit which has reactor and switching device; and a control circuit which changes a feedback value of duty ratio of the switching device so that a deviation between a target value of output voltage and a detection value of output voltage approaches to 0, wherein the control circuit changes a frequency characteristic of the feedback control, based on at least any two or more of information on the output voltage, information on an input voltage, and information on duty ratio.

11 Claims, 16 Drawing Sheets

FIG. 8C  PROPORTIONAL-INTEGRAL-DIFFERENTIAL CONTROL
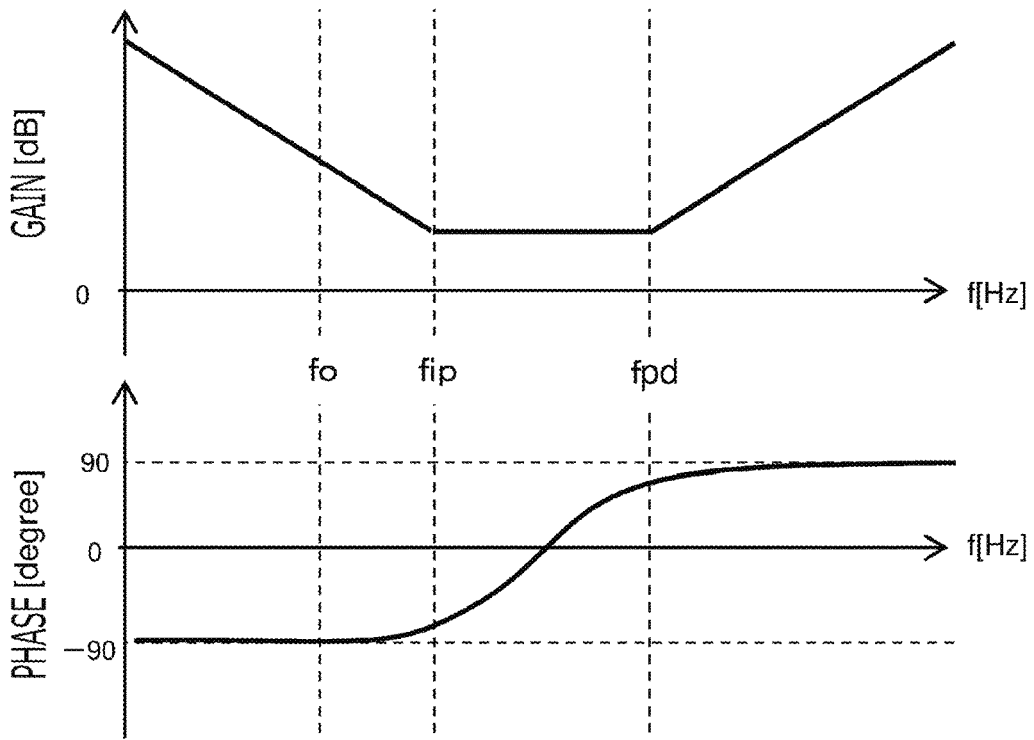
FIG. 8D  INTEGRAL-DIFFERENTIAL CONTROL
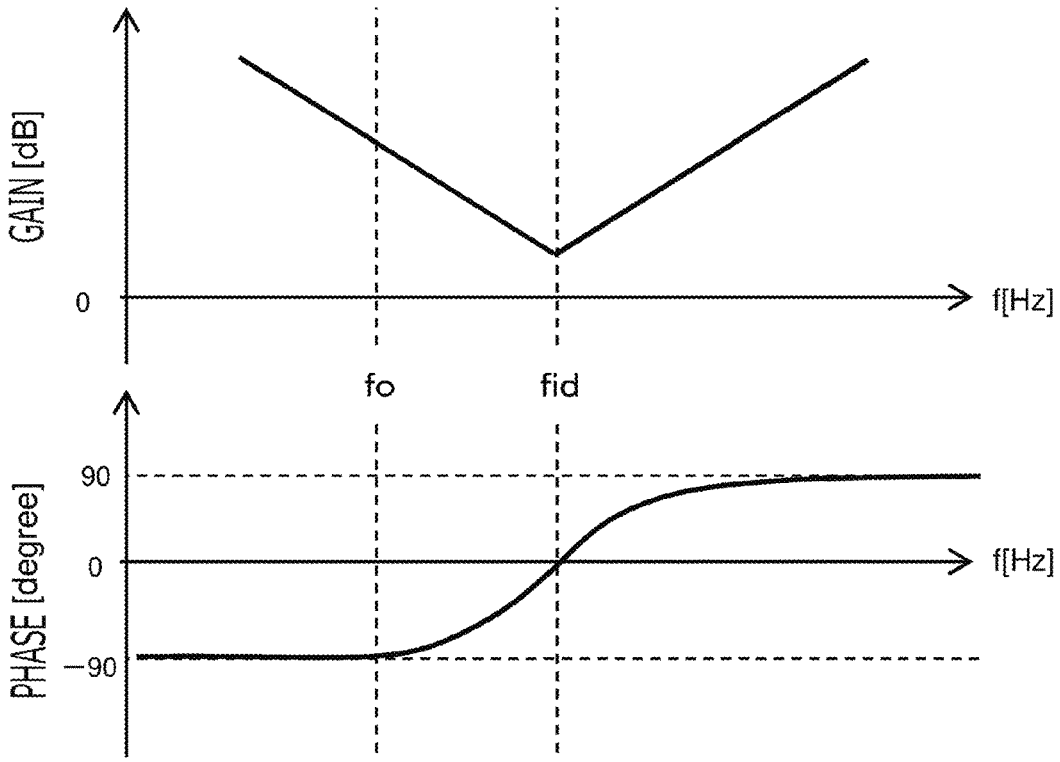

DIFFERENTIAL CONTROL

PROPORTIONAL-DIFFERENTIAL CONTROL

FIG. 11

Operation A

- integrates a value obtained by multiplying deviation $\Delta vout$ by integral gain $Ki$,
- changes feedback value of duty ratio $Dfb$
- changes the integral gain based on the output voltage, the input voltage, and the duty ratio, so that a gain crossover frequency of an open loop transfer function, which combines a transfer function of the integral control and a transfer function of the chopper circuit, becomes smaller than a resonance frequency of the chopper circuit.

Operation B

- calculates a gain of a proportional element in a transfer function of the chopper circuit representing change of the output voltage with respect to change of the duty ratio, based on the output voltage, the input voltage, and the duty ratio
- changes the integral gain according to a reciprocal of the gain of the proportional element, and a target value of a gain crossover frequency of an open loop transfer function which combines a transfer function of the integral control and a transfer function of the chopper circuit.

FIG. 12

Operation C

- performs calculation based on
$$K_i = \frac{2\pi f_{c0}(1-D)^2}{V_{sss}(1-D) - R_L I_{Lsd}}, \text{ or } K_i = \frac{2\pi f_{c0}(1-D)^2}{V_{sss}(1-D)}$$

Operation D

- sets the target value of the gain crossover frequency to a frequency smaller than a resonance frequency of the chopper circuit which is calculated based on the output voltage, the input voltage, and the duty ratio.

FIG. 13

Operation E

- performs at least differential control which differentiates a value obtained by multiplying the deviation by a differential gain, and changes the feedback value of duty ratio; and
- changes a differential gain based on the output voltage, the input voltage, and the duty ratio, so that a gain crossover frequency of an open loop transfer function, which combines a transfer function of the differential control and a transfer function of the chopper circuit, becomes larger than a resonance frequency of the chopper circuit.

Operation F

- performs at least differential control which differentiates a value obtained by multiplying the deviation by a differential gain, and changes the feedback value of duty ratio;
- calculates a gain of a second order integral element in a transfer function of the chopper circuit representing change of the output voltage with respect to change of the duty ratio, based on the output voltage, the input voltage, and the duty ratio; and
- changes the differential gain according to a reciprocal of the gain of the second order integral element, and a target value of a gain crossover frequency of an open loop transfer function which combines a transfer function of the differential control and a transfer function of the chopper circuit.

FIG. 14

Operation G

- performs calculation based on
$$K_d = \frac{2\pi f_{c\omega} L \cdot C_{out}}{V_{out}(1-D) - R_L I_{Ld}}, \text{ or } K_d = \frac{2\pi f_{c\omega} L \cdot C_{out}}{V_{out}(1-D)}$$

Operation H

- sets a target value of the gain crossover frequency to a frequency larger than the resonance frequency of the chopper circuit and smaller than the break frequency of the chopper circuit.

FIG. 15

Operation I
- when the resonance frequency is smaller than a determination frequency, changes control gain of the feedback control, so that a gain crossover frequency of an open loop transfer function which combines a transfer function of the feedback control and a transfer function of the chopper circuit becomes smaller than the resonance frequency, and exists in a frequency region where integral control included in the feedback control functions; and
- when the resonance frequency is larger than the determination frequency, change control gain of the feedback control, so that the gain crossover frequency of the open loop transfer function becomes larger than the break frequency and smaller than the resonance frequency, and exists in a frequency region where differential control included in the feedback control functions.

Operation J
- changes number of break frequencies of a transfer function of the feedback control, according to whether the resonance frequency is smaller than or larger than the determination frequency.

POWER CONVERTER INCLUDING A FEEDBACK CONTROL SYSTEM

INCORPORATION BY REFERENCE

The disclosure of Japanese Patent Application No. 2018-217877 filed on Nov. 21, 2018 including its specification, claims and drawings, is incorporated herein by reference in its entirety.

BACKGROUND

The present disclosure is related with a power converter. JP 2003-36991 A is disclosed regarding the power converter. In the technology of JP 2003-36991 A, two conversion circuits are connected in series; the pre-stage conversion circuit is a rectifier circuit which rectifies AC voltage; and the post-stage conversion circuit is a step-up type chopper circuit which steps up voltage, detects the output voltage and controls it to the target voltage by feedback control.

SUMMARY

When the operating range of the input and output voltage and load is wide, change of the frequency characteristic of the chopper circuit becomes large. However, in the technology of JP 2003-36991 A, the frequency characteristic of the feedback control is constant Therefore, in order to stabilize the feedback control system even the transfer function of the chopper circuit changes, it is necessary to lower the response of feedback control, and the operating conditions where sufficient response speed cannot be obtained exist.

Thus, it is desired to provide a power converter which can maintain the stability and the response of the feedback control system, even if the frequency characteristic of the chopper circuit changes according to change of driving condition.

A power converter according to the present disclosure, including:

a chopper circuit that is provided with a reactor and a switching device, and converts DC power between an input terminal and an output terminal;

a voltage detection circuit that detects an output voltage outputted from the output terminal; and a control circuit that performs feedback control which changes a feedback value of duty ratio so that a deviation between a target value of the output voltage and a detection value of the output voltage approaches to 0, and controls on/off of the switching device by the feedback value of duty ratio;

wherein the control circuit changes a frequency characteristic of the feedback control, based on at least any two or more of information on the output voltage, information on an input voltage inputted into the input terminal, and information on duty ratio.

According to the power converter of present disclosure, according to the frequency characteristic of the chopper circuit which is changed according to at least any two or more of the output voltage, the input voltage, and the duty ratio, the frequency characteristic of feedback control can he changed appropriately. And, even if driving condition changes, the stability and the response of the feedback control system can be maintained.

BRIEF DESCRIPTION OF THE DRAWINGS

FIG. 8A to FIG. 8D are Bode diagrams of the integral control, the proportional integral control, the proportional integral differential control, and the integral differential control, when functioning the integral control according to Embodiment 1;

FIGS. 10-15 illustrate operations performed by a feedback control unit.

DETAILED DESCRIPTION OF THE EMBODIMENTS

1. Embodiment 1

Figure 1:
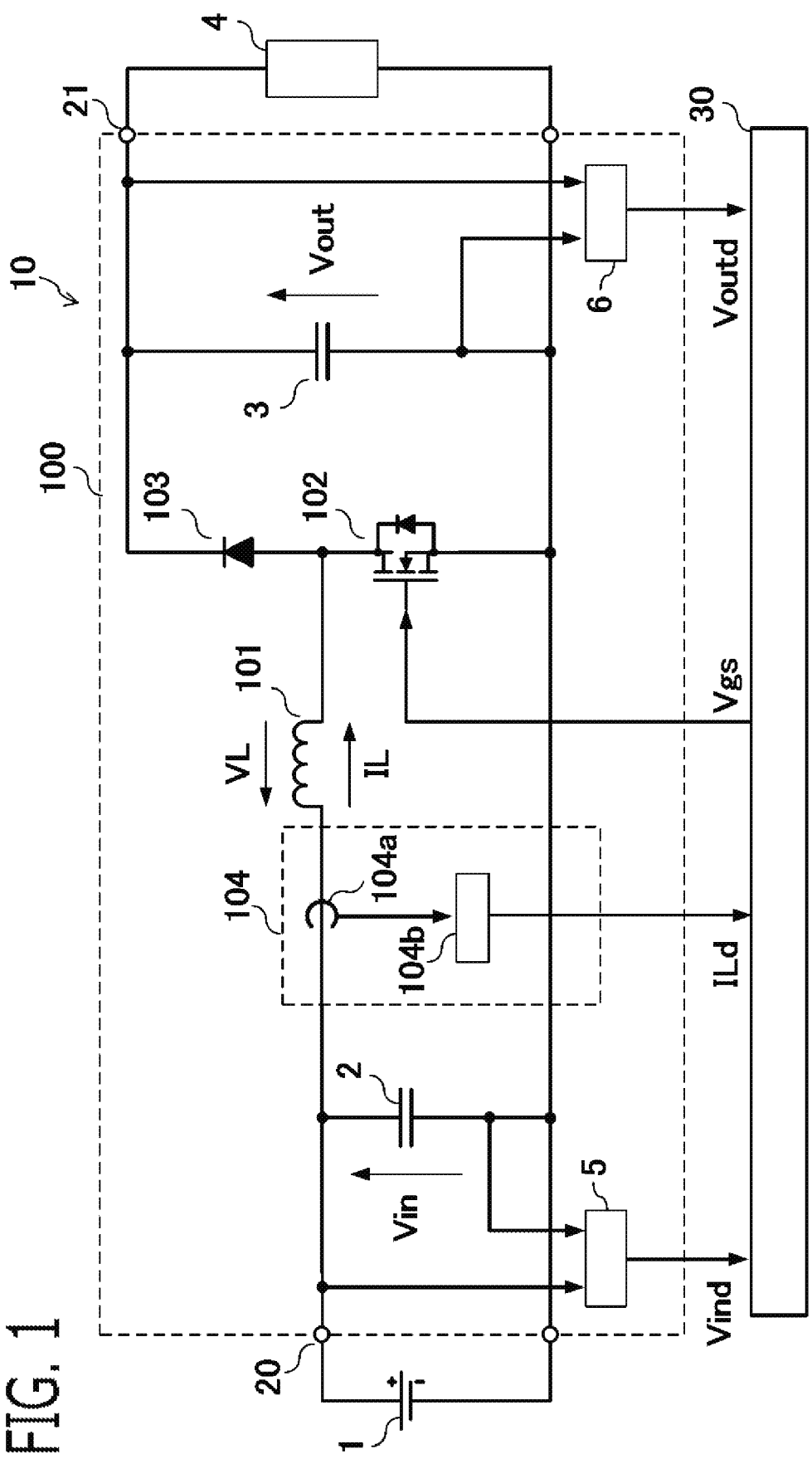
FIG. 1 is a configuration diagram of the power converter according to Embodiment 1.

A power converter 10 according to Embodiment 1 will be explained with reference to drawings. FIG. 1 is a configuration diagram of the power converter 10 according to the present embodiment.

1-1. Chopper Circuit 100

The power converter 10 is provided with a chopper circuit 100. The chopper circuit 100 is a DC power conversion circuit which converts DC power between an input terminal 20 and an output terminal 21. The chopper circuit 100 is provided with a reactor 101 and a switching device 102. In the present embodiment, the chopper circuit 100 is provided with a reactor 101, a switching device 102, and a diode 103.

MOSFET (Metal Oxide Semiconductor Field Effect Transistor) is used for the switching device 102, and it has a parasitic diode connected in inverse parallel. IGBT (Insulated Gate Bipolar Transistor) in which a diode is connected in inverse parallel may be used for the switching device 102. An on/off driving signal Vgs of the control circuit 30 is inputted into a gate terminal of the switching device 102.

In the present embodiment, the chopper circuit 100 is a step-up type conversion circuit. Between a positive electrode side and a negative electrode side of the output terminal 21, from the positive electrode side, the diode 103 and the switching device 102 are connected in series. In detail, a drain terminal of the diode 103 is connected to the positive electrode side of the output terminal 21, a source terminal of the diode 103 is connected to the drain terminal of the switching device 102, and a source terminal of the switching device 102 is connected to the negative electrode side of the output terminal 21. The negative electrode side of the output terminal 21 and the negative electrode side of the input terminal 20 are connected with each other via the ground and the like.

One end of the reactor 101 is connected to the positive electrode side of the input terminal 20, and the other end of the reactor 101 is connected to a connection point of the diode 103 and the switching device 102. A DC power source 1 is connected to the input terminal 20, and a load 4 is connected to the output terminal 21.

The chopper circuit 100 is provided with an output side smoothing capacitor (hereinafter, referred to an output capacitor) just before the output terminal 21. The output capacitor 3 is provided at the output terminal 21 side of the switching device 102 and the diode 103, and is connected between the positive electrode side and the negative electrode side of the output terminal 21, and smooths an output voltage Vout outputted from the output terminal 21.

The chopper circuit 100 is provided with an input side smoothing capacitor 2 (hereinafter, referred to an input capacitor 2) just before the input terminal 20. The input capacitor 2 is provided at the input terminal 20 side of the reactor 101, and is connected between the positive electrode side and the negative electrode side of the input terminal 20, and smooths an input voltage Vin inputted from the input terminal 20.

The power converter 10 is provided with an input voltage detection circuit 5 which detects the input voltage Vin inputted into the input terminal 20, and an output voltage detector 6 which detects the output voltage Vout outputted from the output terminal 21. The input voltage detection circuit 5 detects a both-ends voltage of the input capacitor 2, and the output voltage detector 6 detects a both-ends voltage of the output capacitor 3. An output signal of the input voltage detection circuit 5 and an output signal of the output voltage detector 6 are inputted into the control circuit 30.

The power converter 10 is provided with a current detection circuit 104 which detects a current IL (hereinafter, referred to a reactor current IL) which flows through the reactor 101. In the present embodiment, the current detection circuit 104 is provided with a current sensor 104a, and a filter circuit 104b which performs a low pass filter of the output signal of the current sensor 104a to eliminate a ripple current component. An output signal of the current detection circuit 104 (the filter circuit 104b) is inputted into the control circuit 30.

1-2. Control Circuit 30

The power converter 10 is provided with the control circuit 30 which controls on/off of the switching device 102. The control circuit 30 controls on/off of the switching device 102 by PWM control. PWM control is Pulse Width Modulation control. A duty ratio D is a ratio (ON duty ratio) of a period in which the switching device 102 is turned on with respect to the switching period Tsw, and changes between 0 and 1.

The control circuit 30 is provided with processing circuits which perform on/off control of the switching device 102. The processing circuits of the control circuit 30 may be constituted by digital electronic circuits, such as arithmetic processor and storage apparatus, may be constituted by analog electronic circuits, such as comparator, operational amplifier, and differential amplifying circuit, or may be constituted by both of the digital electronic circuits and the analog electronic circuits.

<Example of Circuit Configuration of Control Circuit 30>

Figure 2:
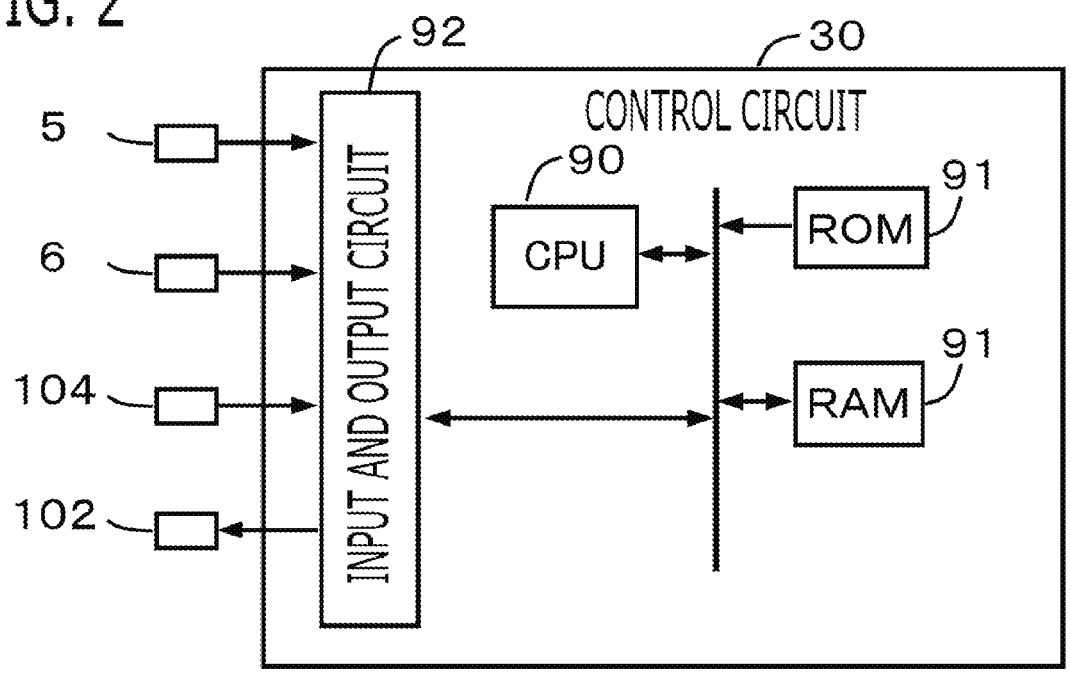
FIG. 2 is a hardware configuration diagram of the control circuit according to Embodiment 1.

FIG. 2 shows a circuit configuration when the control circuit is constituted by digital electronic circuits, such as the arithmetic processor and the storage apparatuses. The control circuit 30 provided, as processing circuits, with an arithmetic processors 90 (computer) such as CPU (Central Processing Unit storage apparatuses 91 such as RAM (Random Access Memory) and ROM (Read Only Memory) which exchange data with the arithmetic processor 90, an input and output circuit 92 which outputs and inputs external signals to the arithmetic processor 90, and the like.

As the arithmetic processor 90, ASIC (Application Specific Integrated Circuit), IC (Integrated Circuit), DSP (Digital Signal Processor), FPGA (Field Programmable Gate Array), various kinds of logical circuits, various kinds of signal processing circuits, and the like may be provided. As the arithmetic processor 90, a plurality of the same type ones or the different type ones may be provided, and each processing may be shared and executed. As the storage apparatuses 91, various kinds of storage apparatus, such as a flash memory and EEPROM (Electrically Erasable Programmable Read Only Memory) may be used. The input and output circuit 92 is connected to the input voltage detection circuit 5, the output voltage detector 6, the current detection circuit 104, the switching device 102, and the like; and is provided with an A/D converter, a driving circuit, and the like, which perform transmission and reception of data and a control command between these and the arithmetic processor 90.

Then, the arithmetic processor 90 runs software items (programs) stored in the storage apparatus 91 such as ROM, and collaborates with other hardware devices in the control circuit 30, such as the storage apparatus 91 and the input and output circuit 92, so that the respective functions of the processing units 31 to 35 described below of the control circuit 30 are realized.

1-2-1. Basic Configuration of Control Circuit 30

Figure 3:
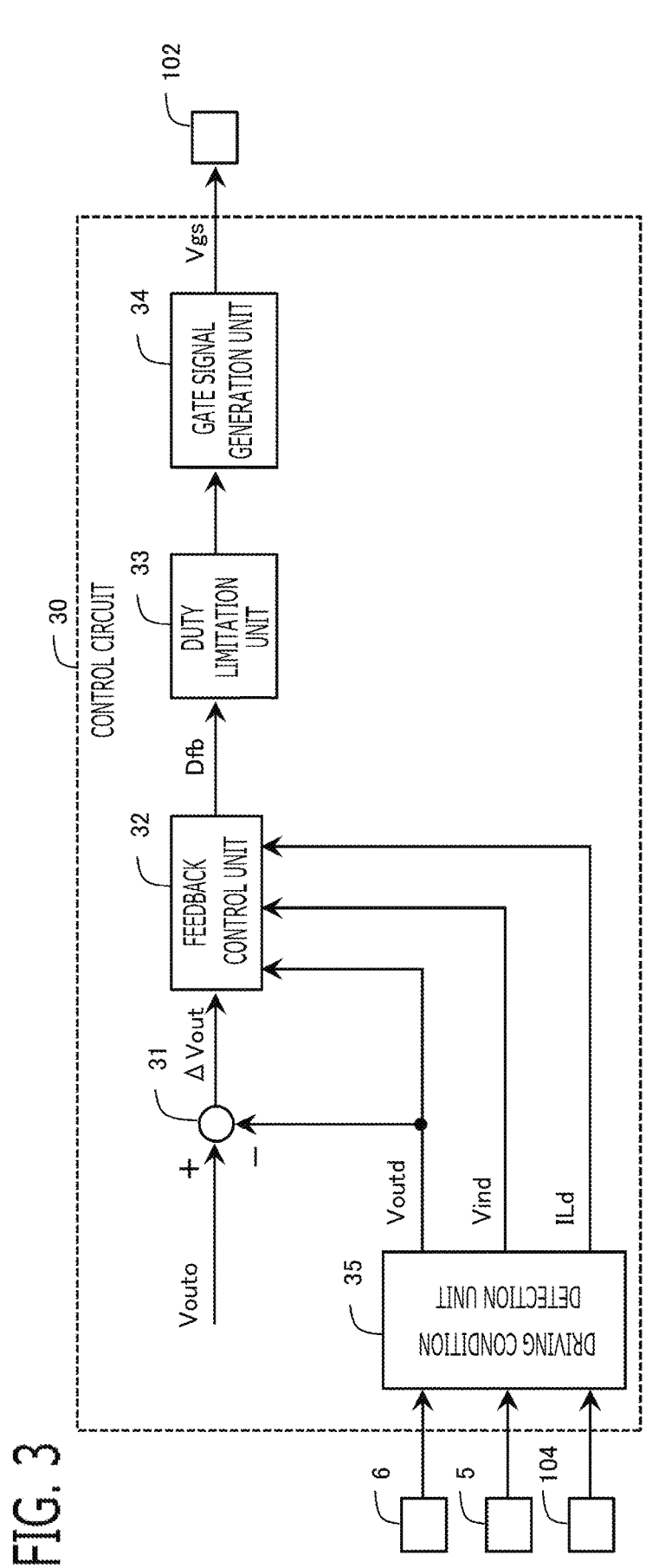
FIG. 3 is a block diagram of the control circuit according to Embodiment 1.

As shown in the block diagram of FIG. 3, the control circuit 30 performs feedback control which changes a feedback value of duty ratio Dfb, so that a deviation ΔVout between a target value of output voltage Vouto and a detection value of output voltage Voutd decreases; and controls on/off of the switching device 102 by the feedback value of duty ratio Dfb.

In the present embodiment, the control circuit 30 is provided with a subtraction unit 31, a feedback control unit 32, a duty limitation unit 33, a gate signal generation unit 34, and a driving condition detection unit 35. The driving condition detection unit 35 detects an input voltage Vind based on the output signal of the input voltage detection circuit 5, detects an output voltage Voutd based on the output signal of the output voltage detector 6, and detects a reactor current ILd based on the output signal of the current detection circuit 104.

The subtraction unit 31 calculates the deviation ΔVout by subtracting the detection value of output voltage Voutd from the target value of output voltage Vouto. The feedback control unit 32 performs feedback control which changes the feedback value of duty ratio Dfb, so that the deviation ΔVout approaches 0. Detail of feedback control is described below. The duty limitation unit 33 performs upper limitation processing and lower limitation processing to the feedback value of duty ratio Dfb. In this example, the duty limitation unit 33 lower-limits the feedback value of duty ratio Dfb by 0, and upper-limits it by 1 (0<=Dfb<=1).

Figure 4:
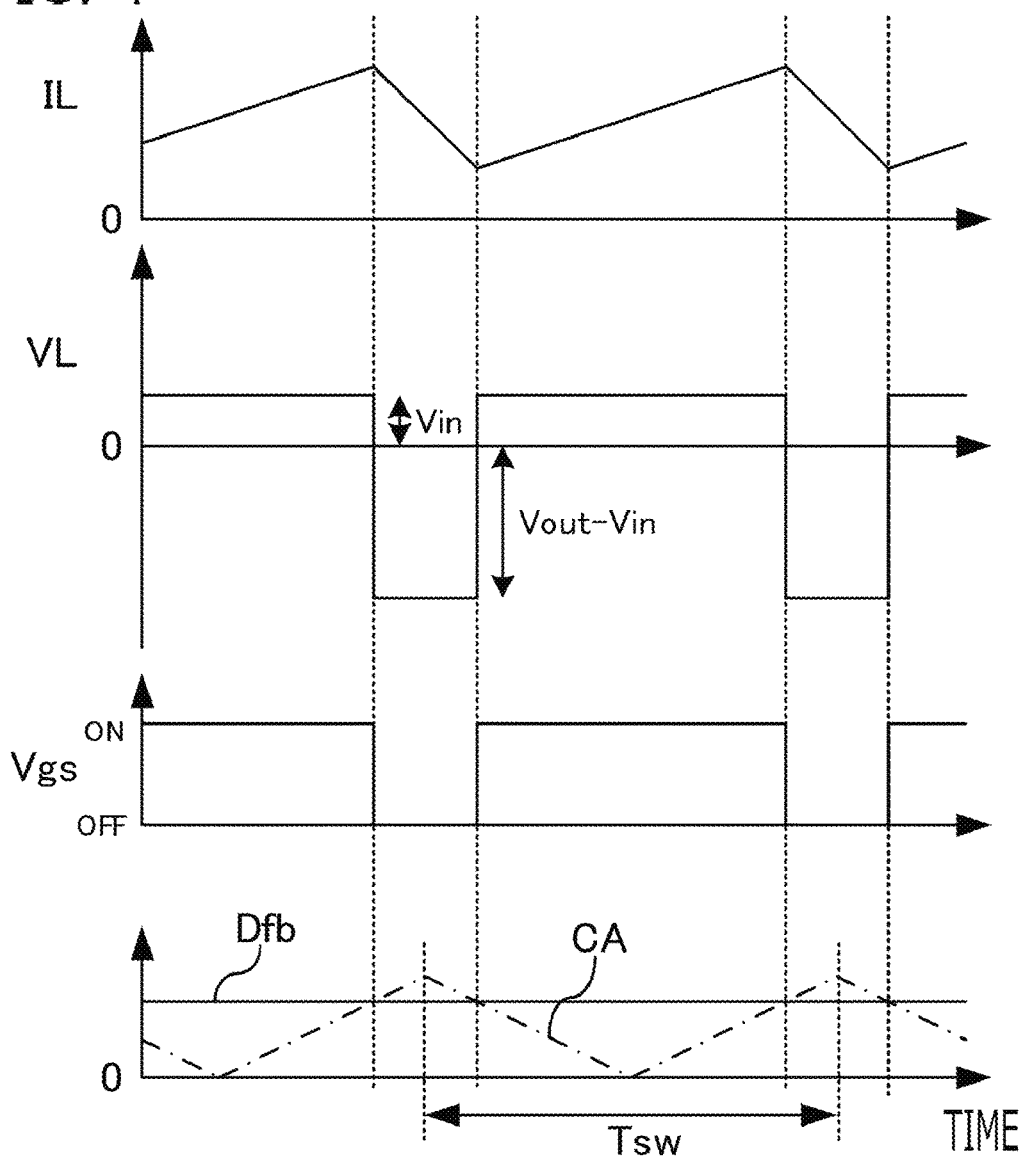
FIG. 4 is a time chart for explaining the on/off control of the switching device according to Embodiment 1.

As shown in FIG. 4, the gate signal generation unit 34 compares the feedback value of duty ratio Dfb after upper and lower limitation with a carrier wave CA, and generates the gate signal Vgs of the switching device 102. The carrier wave CA is a triangular wave which oscillates between 0 and 1 at a switching period Tsw. When the feedback value Dfb exceeds carrier wave CA, the gate signal Vgs is turned ON, and when the feedback value Dfb is below the carrier wave CA, the gate signal Vgs is turned OFF. FIG. 4 shows the reactor current IL and an applied voltage VL to the reactor 101 at this time.

1-2-2. Configuration of Feedback Control
1-2-2-1. Theoretical Explanation
<Transfer Function>

Figure 5:
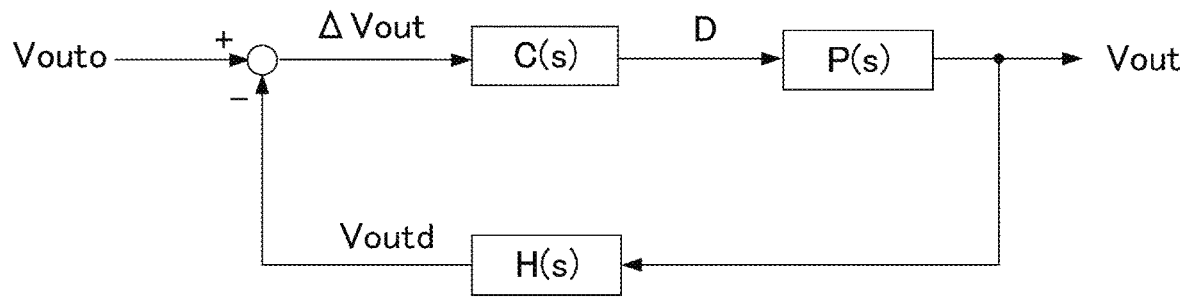
FIG. 5 is a block diagram of the feedback control system of the output voltage according to Embodiment 1.

FIG. 5 shows a block diagram of a feedback control system of output voltage. C(s) is a transfer function of the feedback control (the control circuit 30), P(s) is a transfer function of the chopper circuit, and H(s) is a transfer function of the output voltage detector 6. An open loop transfer function Go(s) of this feedback control system becomes an equation (1).

$$Go(s) = C(s)P(s)H(s) \approx C(s)P(s) \qquad (1)$$

The transfer function H(s) of the output voltage detector 6 becomes a transfer function of a noise cut low pass filter. However, since the transfer function H(s) can be approximated to 1 in a control band, it is omitted. The determination of stability is performed using the open loop transfer function Go(s) of the equation (1).

<Transfer Function of Chopper Circuit>

The transfer function P(s) of the chopper circuit is a transfer function representing change of the output voltage Vout with respect to change of duty ratio D, and is given by an equation (2).

$$P(s) = \frac{V_{out}(1-D) - R_L I_L}{(1-D)^2} \left\{ 1 - \frac{L \cdot I_L}{V_{out}(1-D) - R_L I_L} s \right\} \qquad (2)$$

$$\frac{\left(\frac{1-D}{\sqrt{L \cdot C_{out}}}\right)^2}{s^2 + 2\frac{R_L}{2(1-D)}\sqrt{\frac{C_{out}}{L}} \frac{1-D}{\sqrt{L \cdot C_{out}}} s + \left(\frac{1-D}{\sqrt{L \cdot C_{out}}}\right)^2}$$

Herein, Vout is the output voltage, D is the duty ratio, RL is a resistance value of the reactor 101, IL is the reactor current, L is an inductance of the reactor 101, Cout is a capacity of the output side smoothing capacitor 3, and s is a Laplace operator.

As shown in the equation (2), the transfer function P(s) of the chopper circuit can be expressed by a proportional element corresponding to he first fraction, a first order lead element having a minus time constant and corresponding to in the next parenthesis { }, and a second order vibration system element corresponding to the last fraction.

Figure 6:
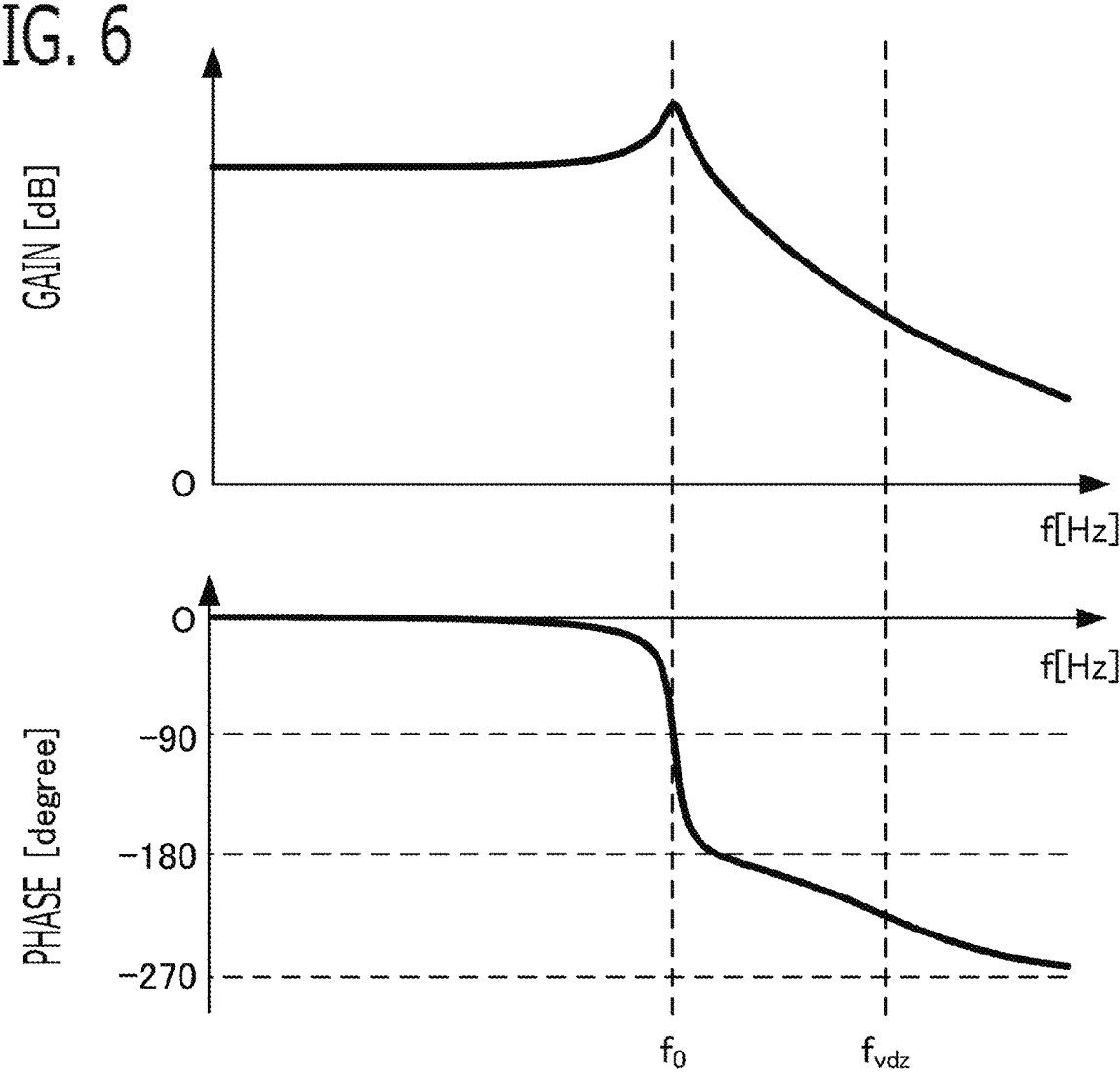
FIG. 6 is a Bode diagram of the transfer function of the chopper circuit according to Embodiment 1.

FIG. 6 shows an outline of the Bode diagram of the equation (2). Herein, a resonance frequency f0 of the second order vibration system element shown in FIG. 6 is expressed by an equation (3) from the last fraction of the equation (2).

$$f_0 = \frac{1-D}{2\pi\sqrt{L \cdot C_{out}}} \qquad (3)$$

A break frequency fvdz of the first order lead element having the minus time constant which is shown in FIG. 6 is expressed by an equation (4) from a reciprocal of the time constant in the parenthesis { } of the equation (2). Herein, since the resistance value RL is a very small value in many cases, the term of RL×IL can also be ignored as 0.

$$f_{vdz} = \frac{V_{out}(1-D) - R_L I_L}{2\pi L \cdot I_L} \qquad (4)$$

The region of frequency f is divided into three, bordering on the resonance frequency f0 of the second order vibration system element and the break frequency fvdz of the first order lead element. In each region, the transfer function P(s) of the chopper circuit can be approximated such as an equation (5). Herein, since the resistance value RL is a very small value in many cases, the term of RL×IL can also be ignored as 0.

1) When $f < f_0$ $\qquad (5)$ $$P(s) \approx \frac{V_{out}(1-D) - R_L I_L}{(1-D)^2}$$

2) When $f_0 < f < f_{vdz}$ $$P(s) \approx \frac{V_{out}(1-D) - R_L I_L}{L \cdot C_{out} s^2}$$

3) When $f_{vdz} < f$ $$P(s) \approx -\frac{I_L}{C_{out} s}$$

As shown in the equation (5), in a region (f<f0) where the frequency f is smaller than the resonance frequency f0 of the second order vibration system element, the transfer function P(s) of the chopper circuit can be approximated by the proportional element of the equation (2). In a region (f0<f<fvdz) where the frequency f is larger than the resonance frequency f0 and is smaller than the break frequency fvdz of the first order lead element, the transfer function P(s) of the chopper circuit can be approximated by the second order integral element of the equation (2). The second order integral element is the one in which the proportional element is multiplied to the second order integral element in the second order vibration system element of the equation (2). In a region (fvdz<f) where the frequency f is larger than the break frequency fvdz of the first order lead element, the transfer function P(s) of the chopper circuit can be approximated by the first order integral element of the equation (2). The first order integral element is the one in which the second order integral element in the second order vibration system element and the proportional element are multiplied to the first order differential element of first order lead of the equation (2).

<Stabilization of Feedback Control System>

The transfer function C(s) of feedback control is set so as to stabilize the feedback control system. In order to stabilize, ideally, at the gain crossover frequency fc of the open loop transfer function Go(s), a gain inclination is set to −20 dB/dec, and a phase is set to −90 degrees (a phase margin is set to 90 degrees). Practically, these do not become ideal values due to a time lag by a filter and calculation processing, an improvement in the response speed sacrificing stability, or the like. Even in this case, in order to stabilize, at the gain crossover frequency fc, the gain inclination must be smaller than 0 dB/dec, and the phase must be larger than −180 degrees (a phase margin is larger than 0 degree).

<Stabilization by Setting of Integral Gain in Region of fc<f0>

Figure 7:
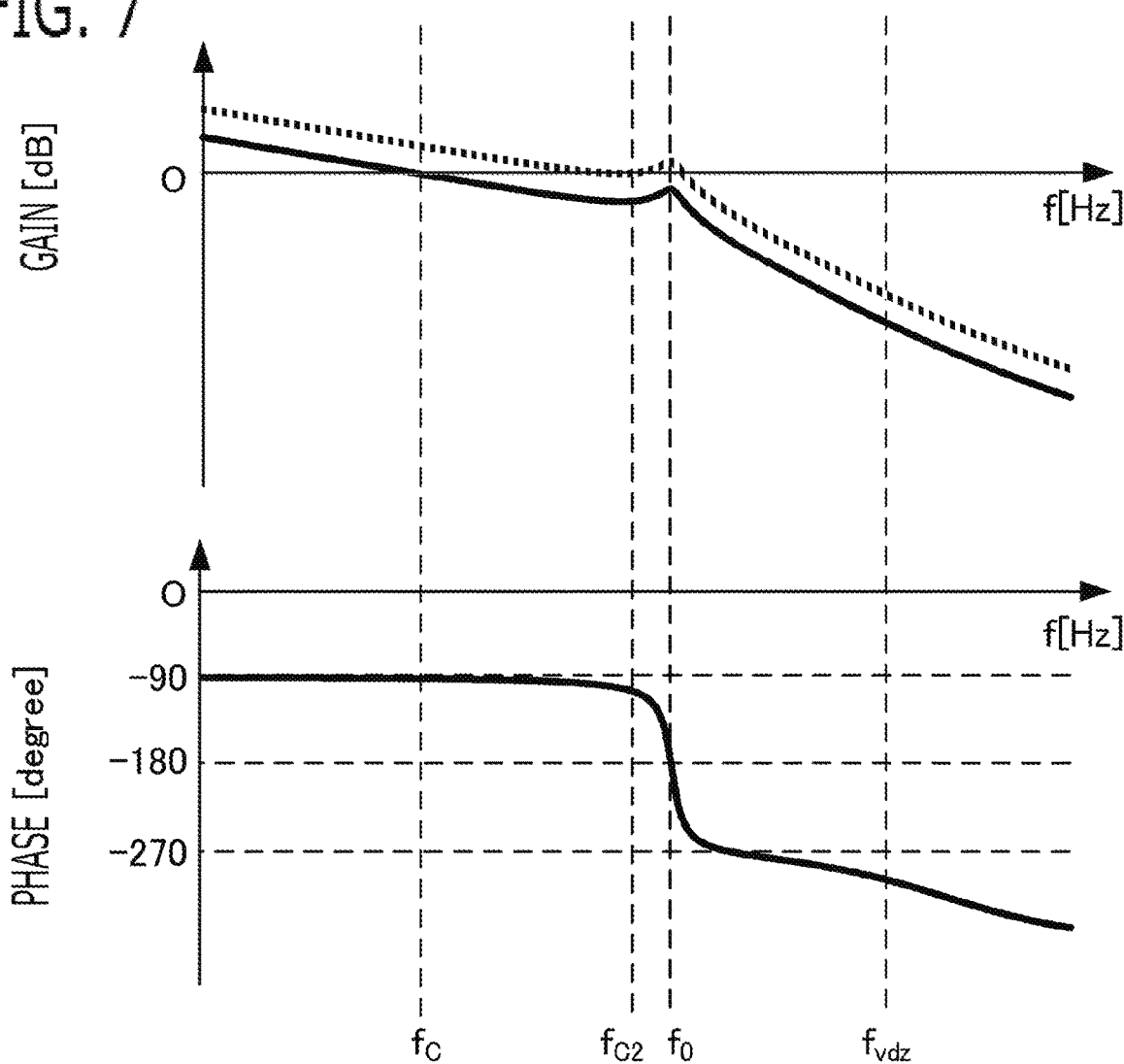
FIG. 7 is a Bode diagram of the open loop transfer function when functioning the integral control according to Embodiment 1.
Figure 8A:
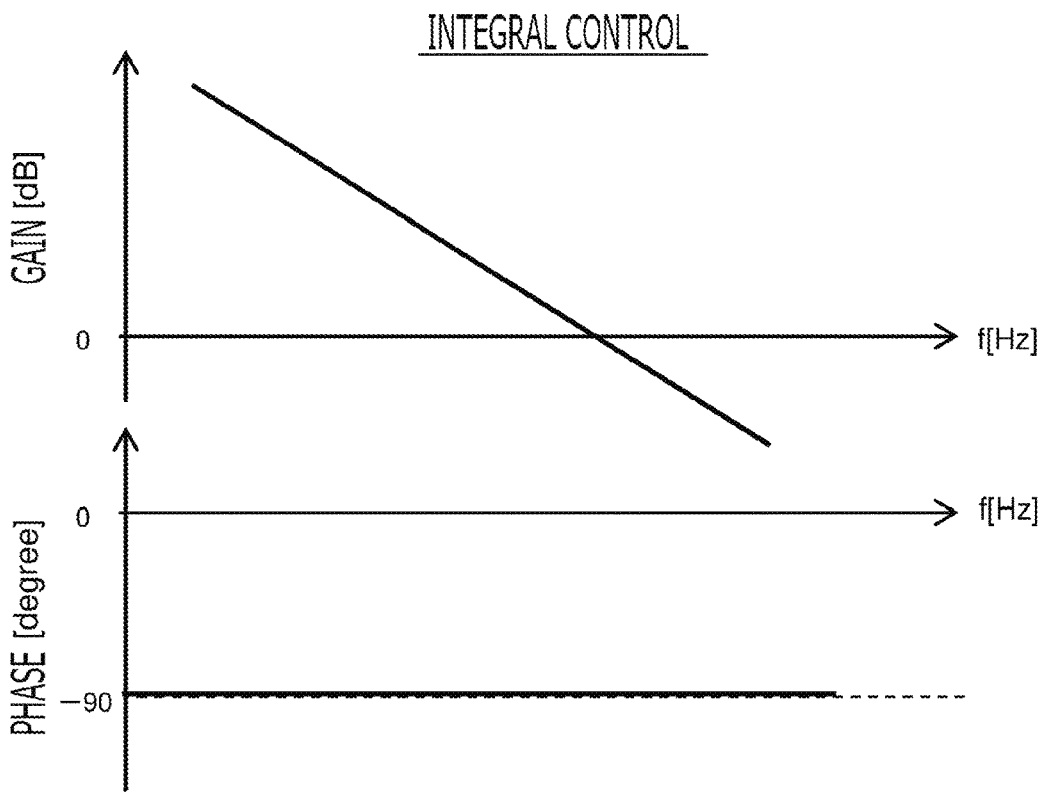
Figure 8B:
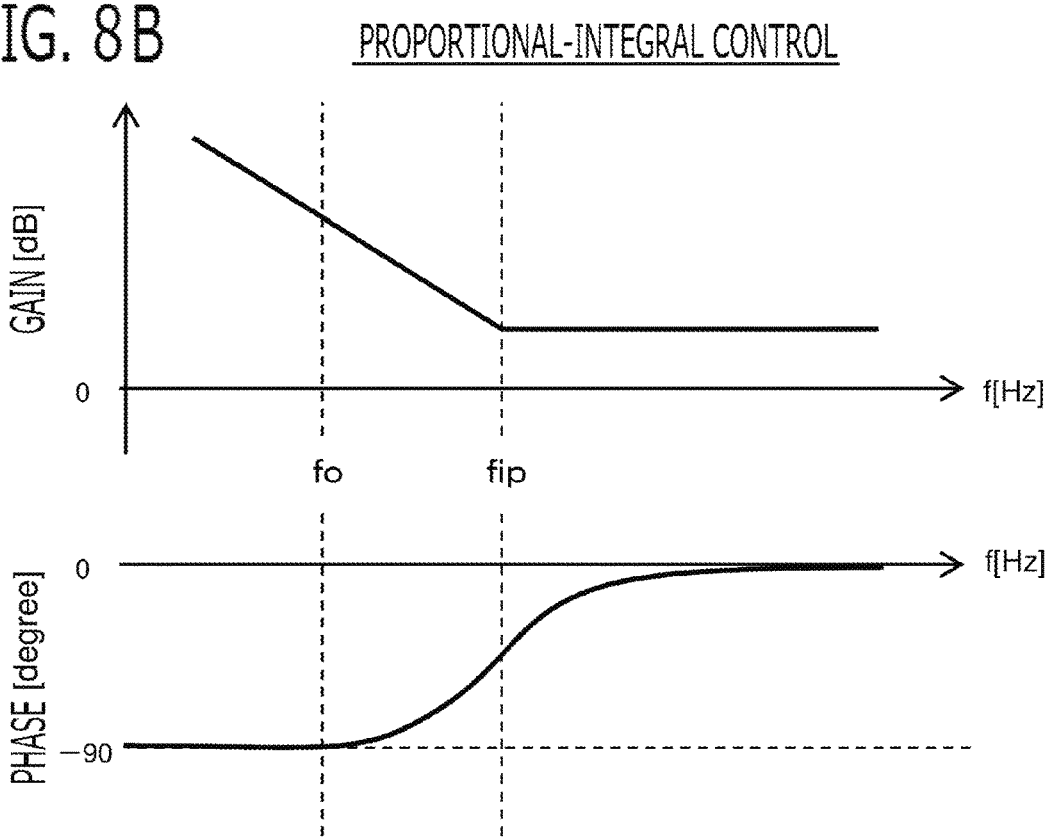
Figure 9A:
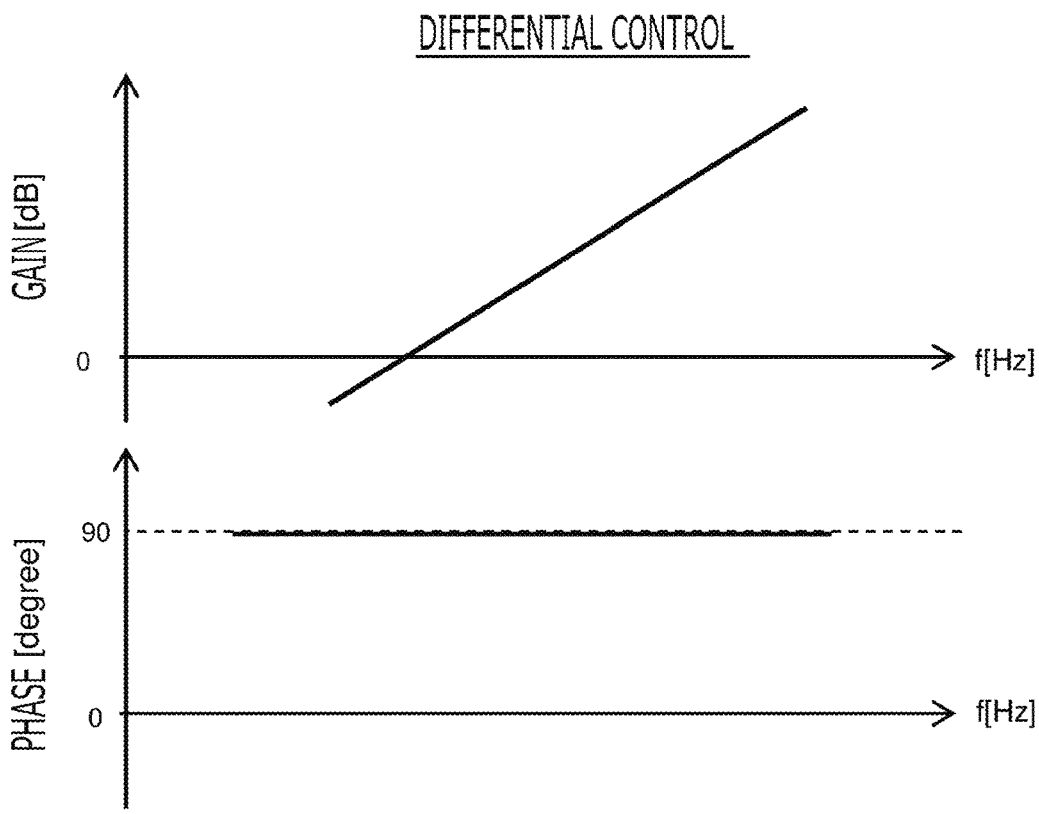
FIG. 9A to FIG. 9D are Bode diagrams of the differential control, the proportional differential control, the proportional integral differential control, and the integral differential control, when functioning the differential control according to Embodiment 1.
Figure 9B:
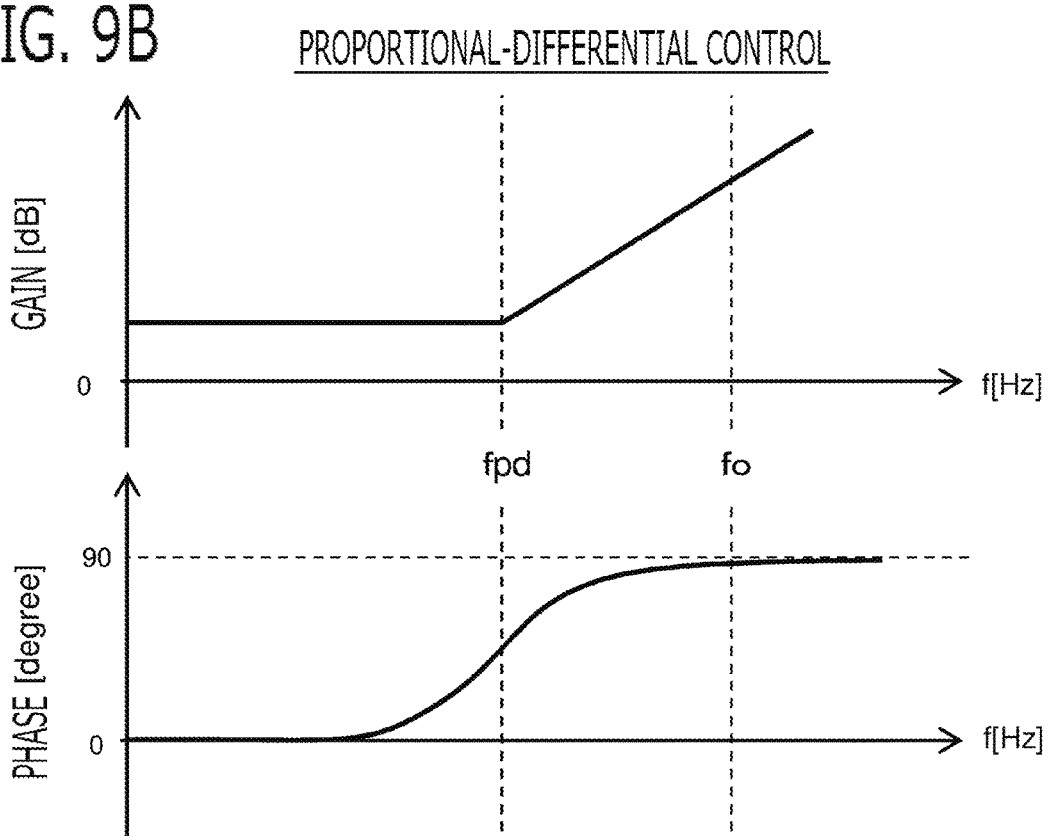
Figure 9C:
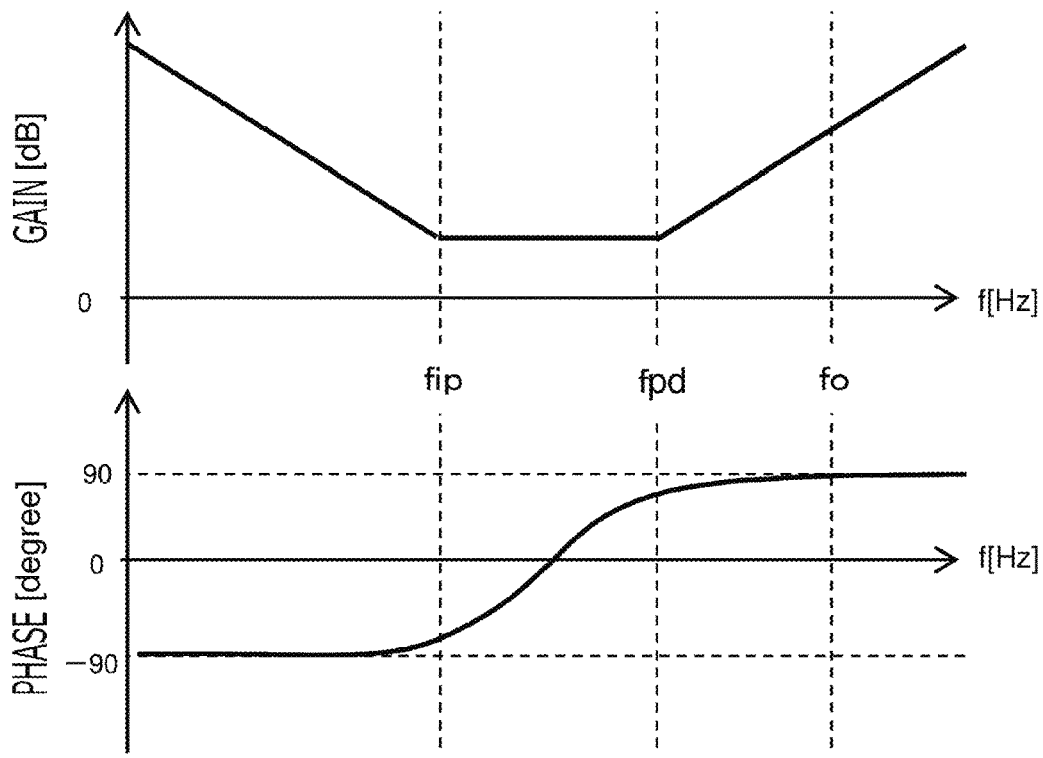
Figure 9D:
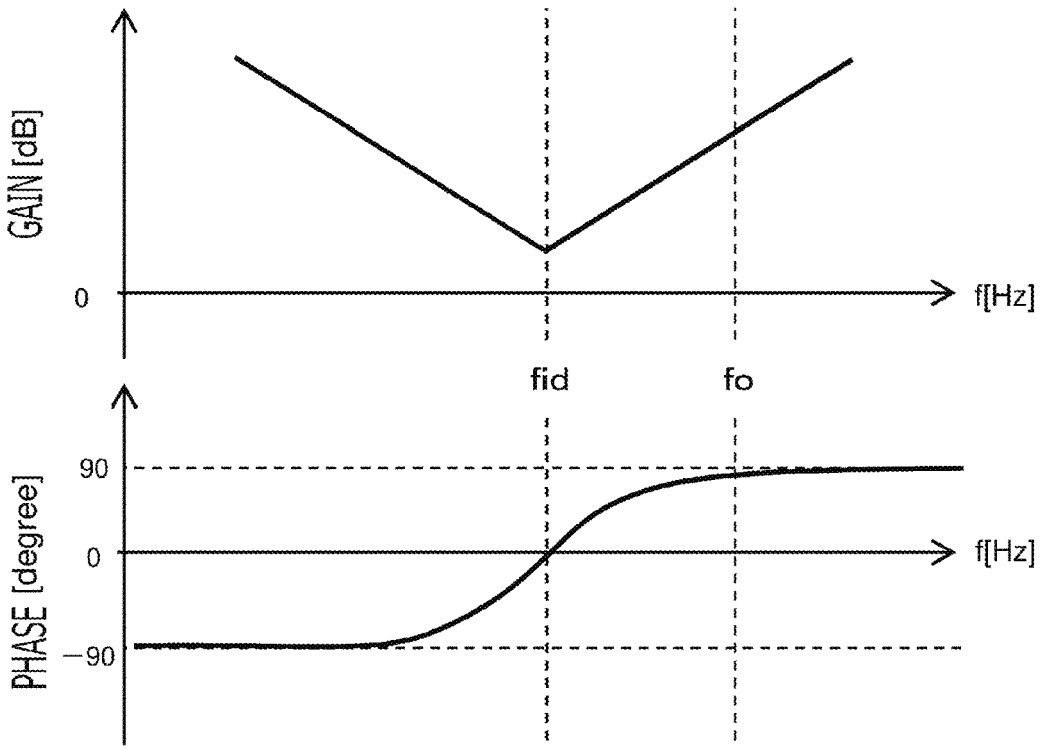

First, as shown in FIG. 7, the setting method in the case where the gain crossover frequency fc is set in the region (f<f0) where the frequency f is smaller than the resonance frequency f0 of the second order vibration systems element will he explained. As shown in the equation (6), in the region of f<f0, the transfer function P(s) of the chopper circuit can be approximated by the proportional element of the first equation of the equation (5). Therefore, for stabilization, the integral element of the transfer function C(s) of feedback control is made to function at the gain crossover frequency fc. For that purpose, C(s) is set to the one in which the integral gain Ki is divided by s. Since a gain inclination of the proportional element is 0 dB/dec (refer to FIG. 6) and a gain inclination of the integral element is −20 dB/dec, the gain inclination combined with both becomes −20 dB/dec as shown in FIG. 7. In this case, in order to make the gain of the open loop transfer function Go(s) cross 0 dB at the gain crossover frequency fc, $|Go(j2\pi fc)|=1$ needs to be established, as shown in the equation (6).

$$1) \text{ When } f < f_0 \qquad (6)$$
$$C(s) \approx \frac{K_i}{s}, \; P(s) \approx \frac{V_{out}(1-D)-R_L I_L}{(1-D)^2}$$
$$G_o(s) \approx C(s)P(s)$$
$$|G_o(j2\pi f_c)| \approx |C(j2\pi f_c)P(j2\pi f_c)| = \left|\frac{K_i}{j2\pi f_c}\frac{V_{out}(1-D)-R_L I_L}{(1-D)^2}\right| = 1$$

When modifying the last equation of the equation (6), a setting equation of the integral gain Ki is obtained as shown in an equation (7). Herein, since the resistance value RL is a very small value in many cases, the term of RL×IL can also be ignored as 0.

$$K_i = \frac{2\pi f_c(1-D)^2}{V_{out}(1-D)-R_L I_L} \qquad (7)$$

That is to say, when the integral gain Ki is set according to the equation (7), the gain inclination of the open loop transfer function Go(s) can be brought close to −20 dB/dec and the phase can be brought close to −90 degrees, by the integral element of the transfer function C(s) of feedback control, at the gain crossover frequency fc; and the feedback control system becomes stable.

However, stability is deteriorated when the gain crossover frequency fc is too close to the resonance frequency f0 (for example, like fc2 of FIG. 7), even if the gain crossover frequency fc is smaller than the resonance frequency f0. Accordingly, when the gain crossover frequency is set in the region of f<f0, it is desirable that the gain crossover frequency fc is not too close to the resonance frequency f0. For example, the gain crossover frequency fc may be set less than or equal to half of the resonance frequency f0.

<Stabilization by Setting of Differential Gain in Region of f0<fc<fvdz>

Next, the setting method in the case where the gain crossover frequency fc is set in the region (f0<f<fvdz) where the frequency f is larger than the resonance frequency f0 of the second order vibration system element and is smaller than the break frequency fvdz of the first order lead element will be explained. As shown in an equation (8), in the region of f0<f<fvdz, the transfer function P(s) of the chopper circuit can be approximated to the second order integral element of the second equation of the equation (5). Therefore, for stabilization, the differential element of the transfer function C(s) of feedback control is made to function at the gain crossover frequency fc. For that purpose, C(s) is set to the one in which the differential gain Kd is multiplied to s. When combining the second order integral element and the differential element, it becomes an integral element ($1/s^2 \times s = 1/s$). Therefore, at the resonance frequency f0, the gain inclination of the open loop transfer function Go(s) can be brought close to −20 dB/dec, and the phase can be brought close to −90 degrees. In this case, in order to make the gain of the open loop transfer function Go(s) cross 0 dB at the gain crossover frequency fc, $|Go(j2\pi fc)|=1$ needs to be established, as shown in the equation (8).

$$2) \text{ When } f_0 < f < fvdz \qquad (8)$$
$$C(s) \approx K_d s, \; P(s) \approx \frac{V_{out}(1-D)-R_L I_L}{L \cdot C_{out} s^2}$$
$$G_o(s) \approx C(s)P(s)$$
$$|G_o(j2\pi f_c)| \approx |C(j2\pi f_c)P(j2\pi f_c)| = \left|K_d j2\pi f_c \frac{V_{out}(1-D)-R_L I_L}{L \cdot C_{out}(j2\pi f_c)}\right| = 1$$

When modifying the last equation of the equation (8), a setting equation of the differential gain Kd is obtained as shown in an equation (9). Herein, since the resistance value RL is a very small value in many cases, the term of RL×IL can also be ignored as 0.

$$K_d = \frac{2\pi f_c L \cdot C_{out}}{V_{out}(1-D)-R_L I_L} \qquad (9)$$

That is to say, when the differential gain Kd is set according to the equation (9), the gain inclination of the open loop transfer function Go(s) can be brought close to −20 dB/dec and the phase can be brought close to −90 degrees, by the differential element of the transfer function C(s) of feedback control, at the gain crossover frequency fc; and the feedback control system becomes stable. For example, the gain crossover frequency fc is set to greater than or equal to twice the resonance frequency f0, and is set to less than or equal to half of the break frequency fvdz.

<In Region of fvdz<fc>

Lastly, in the region (fvdz<f) where the frequency f is larger than break frequency fvdz of the first order lead, the phase of the transfer function P(s) of the chopper circuit is converged to −270 degrees, and it cannot be stabilized by three kinds of combination of the proportional element, the integral element, and the differential element. Therefore, the gain crossover frequency not set in this region.

<Restrictions Due to Switching Frequency>

Other than the restrictions due to the transfer function P(s) of the chopper circuit, the restrictions due to the switching frequency fsw also exist. The switching frequency fsw is a reciprocal of the switching period Tsw. Generally, if the gain crossover frequency fc is not set to less than or equal to from 1/10 to 1/20 of the switching frequency fsw (for example, less than or equal to 1/20), the phase rotates due to the influence of the time lag by filter and calculation processing, and it does not become stable.

<Transfer Function of Feedback Control>

From above, the conditions that the transfer function C(s) of feedback control should satisfy become the equation (10). Herein, since the resistance value RL is a very small value in many cases, the term of RL×IL can also be ignored as 0.

1) When $f_c < f_0$, $f_c < \frac{1}{20}f_{sw}$ (10)

$$\lim_{s \to j2\pi f_c} C(s) = \frac{2\pi f_c(1-D)^2}{V_{out}(1-D) - R_L I_L} \frac{1}{s}$$

2) When $f_0 < f_c < f_{vdz}$, $f_c < \frac{1}{20}f_{sw}$ $$\lim_{s \to j2\pi f_c} C(s) = \frac{2\pi f_c L \cdot C_{out}}{V_{out}(1-D) - R_L I_L} s$$

Herein, for stabilization, it is necessary to satisfy the conditions that the gain crossover frequency fc is made smaller than the break frequency fvdz of the first order lead element and is made smaller than the switching frequency fsw.

In each frequency of 1) or 2) of the equation (10), if the equation (10) is satisfied, any transfer function C(s) of feedback control may be used. For example, in the condition of fc<f0 and fc<fsw/20 of 1), the feedback control should be provided with the integral element at least; in order to make the integral element function at the gain crossover frequency fc, it may be integral control, or it may be proportional integral control, proportional integral differential control, or integral differential control, in which each break frequency is larger than the resonance frequency f0.

FIG. 8A to FIG. 8D show the Bode diagrams of the integral control, the proportional integral control, the proportional integral differential control, and the integral differential control. As shown in an equation (11), the transfer function Cp(s) of the proportional control, the transfer function Ci(s) of the integral control, and the transfer function Cd(s) of the differential control are set. Herein, Kp is a proportional gain, Ki is an integral gain, and Kd is a differential gain.

$$C_p(s) = K_p, \ C_i(s) = K_i \frac{1}{s}, \ C_d(s) = K_d s \quad (11)$$

In the case of the proportional integral control, as shown in an equation (12), by making the break frequency fip, which is a boundary of the integral element and the proportional element, larger than the resonance frequency f0, the integral element functions at the resonance frequency f0; and by setting the integral gain Ki like the first equation of the equation (10), the control system can be stabilized. In the case of the proportional integral differential control, as shown in the equation (12), by making the break frequency fip, which is a boundary of the integral element and the proportional element, and the break frequency fpd, which is a boundary of the proportional element and the differential element, larger than the resonance frequency f0, the integral element functions at the resonance frequency f0; and by setting the integral gain Ki like the first equation of the equation (10), the control system can be stabilized. In the case of the integral differential control, as shown in an equation (12), by making the break frequency fid, which is a boundary of the integral element and the differential element, larger than the resonance frequency f0, the integral element functions at the resonance frequency f0; and by setting the integral gain Ki like the first equation of the equation (10), the control system can be stabilized.

$$f_{ip} = \frac{1}{2\pi} \frac{K_i}{K_p} > f_0, \ f_{pd} = \frac{1}{2\pi} \frac{K_p}{K_d} > f_0, \quad (12)$$

$$f_{id} = \frac{1}{2\pi} \frac{K_i + \frac{1}{K_d}}{2} > f_0$$

In the conditions of f0<fc<fvdz and fc<fsw/20 of 2), the feedback control should be provided with the differential element at least; in order to make the differential element function at the gain crossover frequency fc, it may be the differential control, or it may be the integral differential control, the proportional integral differential control, or the proportional differential control, in which each break frequency is smaller than the resonance frequency f0.

FIG. 9A to FIG. 9D show the Bode diagrams of the differential control, the proportional differential control, the proportional integral differential control, and the integral differential control. In the case of the proportional differential control, as shown in an equation (13), by making the break frequency fpd, which is a boundary of the proportional element and the differential element, smaller than the resonance frequency f0, the differential element functions at the resonance frequency f0; and by setting the differential gain Kd like the second equation of the equation (10), the control system can be stabilized. In the case of the proportional integral differential control, as shown in an equation (13), by making the break frequency fip, which is a boundary of the integral element and the proportional element, and making the break frequency fpd, which is a boundary of the proportional element and the differential element, smaller than the resonance frequency f0, the differential element functions at the resonance frequency f0; and by setting the differential gain Kd like the second equation of the equation (10), the control system can be stabilized. In the case of the integral differential control, as shown in an equation (13), by making the break frequency fid, which is a boundary of the integral element and the differential element, smaller than the resonance frequency f0, the differential element functions at the resonance frequency f0; and by setting the differential gain Kd like the second equation of the equation (10), the control system can be stabilized.

$$f_{pd} = \frac{1}{2\pi} \frac{K_p}{K_d} > f_0, \ f_{ip} = \frac{1}{2\pi} \frac{K_i}{K_p} < f_0, \quad (13)$$

$$f_{id} = \frac{1}{2\pi} \frac{K_i + \frac{1}{K_d}}{2} < f_0$$

If fixed values are used for the integral gain Ki and the differential gain Kd, from the equation (7) and the equation (9), when operating conditions, such as the duty ratio D, the output voltage Vout, and the reactor current IL, change, the gain crossover frequency fc also changes. If the term of RL×IL is ignored as 0, change of the operating condition of the reactor current IL can be ignored. Therefore, depending on operating conditions, stability is deteriorated, or required response speed is not obtained. Therefore, by changing the integral gain Ki and the differential gain Kd based on the equation (7) and the equation (9), even if operating conditions change, stability can be maintained and the required response speed can be obtained.

As shown in the equation (3), although the resonance frequency f0 changes by the duty ratio D, if the control gain is the fixed value, it must be stabilized at all the resonance frequencies f0; in order to satisfy the conditions of fc<f0 and fc<fsw/20 of 1) of the equation (10), it is necessary to make the gain crossover frequency fc small; and depending on operating conditions, stability is deteriorated, or required response speed is not obtained.

Then, the control gain of feedback control which performs at least the integral control and the differential control is changed, so as to make the integral element function at the gain crossover frequency fc in the duty ratio D in which the resonance frequency f0 becomes large, and make the differential element function at the gain crossover frequency fc in the duty ratio D in which the resonance frequency f0 becomes small. Thereby, by changing the break frequency or switching the feedback control between the integral control and the differential control, regardless of the duty ratio D, stability can be maintained and the required response speed can be obtained.

1-2-2-2. Configuration of Feedback Control

Then, the feedback control unit 32 changes a frequency characteristic of the feedback control, based on at least any two or more of the information on the output voltage Vout, the information on the input voltage Vin, and the information on duty ratio D.

As shown in the equation (14), if any two or more of the information on the output voltage Vout, the information on the input voltage Vin, and the information on duty ratio D, are used, the information on the output voltage Vout and the information on duty ratio D can be calculated. And, the equation (14) is substituted to each equation, and it is possible to replace each parameter. Since the term of RL×IL can also be ignored as 0 in each equation, even if the detection value ILd of reactor current is not used, based on at least any two or more of the information on the output voltage Vout, the information on the input voltage Vin, and the information on duty ratio D, the frequency characteristic of feedback control can be changed appropriately, as explained using the equation (7), the equation (8), and the equation (9). Therefore, according to the frequency characteristic of the chopper circuit 100 which is changed according to at least any two or more of the output voltage Vout, the input voltage Vin, and the duty ratio D, the frequency characteristic of feedback control can be changed appropriately. And, even if driving condition changes, the stability and the response of the feedback control system can be maintained.

$$D = 1 - \frac{V_{in}}{V_{out}}, V_{out} = \frac{1}{1-D}V_{in} \tag{14}$$

In the present embodiment, as shown in an equation (15), the feedback control unit 32 uses, as the information on the output voltage Vout, the detection value of output voltage Voutd or the target value of output voltage Vouto; and uses, as the information on the input voltage Vin, the detection value of input voltage Vind or the setting value of input voltage Vin0. Herein, if the DC power source 1 connected to the input terminal 20 is not variable voltage but fixed voltage, the setting value of input voltage Vin0 which is preliminarily t to the rated voltage of DC power source 1 may be used as the information on the input voltage Vin. The feedback control unit 32 uses, as the information on duty ratio D, the feedback value of duty ratio Dfb, or the calculation value of duty ratio Dc calculated based on the information on the output voltage Vout and the information on the input voltage Vin.

$$V_{out} = V_{outd}, \text{ or } V_{out} = V_{outo} \tag{15}$$
$$V_{in} = V_{ind}, \text{ or } V_{in} = V_{in0}$$
$$D = D_{fb}, \text{ or } D = D_c = 1 - \frac{V_{in}}{V_{out}}$$

As mentioned above, in order to stabilize the feedback control system, as shown in the equation (10), there are 1) the case where the gain crossover frequency fc is made smaller than the resonance frequency f0 of the chopper circuit 100 and the integral control of feedback control is made function at the gain crossover frequency fc, and 2) the case where the gain crossover frequency fc is made larger than the resonance frequency f0 of the chopper circuit 100 and the differential control of feedback control is made function at the gain crossover frequency fc. Each case will be explained below.

<The case where the integral control is made function at the gain crossover frequency fc>

Figure 10:
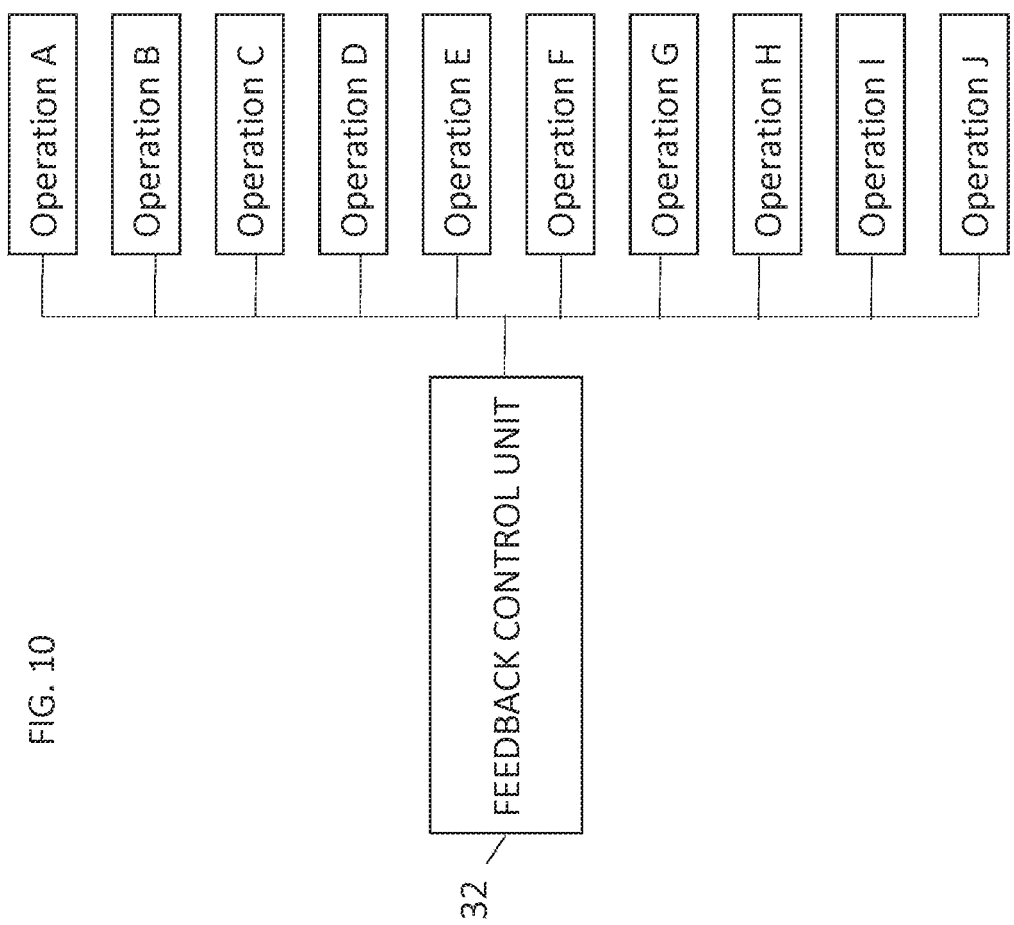

As shown in the equation (16), in the feedback control, the feedback control unit 32 performs at least the integral control which integrates a value obtained by multiplying the integral gain Ki to the deviation ΔVout, and changes the feedback value of duty ratio Dfb. Herein, 1/s expresses integral calculation. See FIG. 10 and Operation A in FIG. 11

$$D_{fb}(s) = \Delta V_{out} K_i \frac{1}{s} \tag{16}$$

Based on at least any two or more of the information on the output voltage Vout, the information on the input voltage Vin, and the information on duty ratio D, the feedback control unit 32 changes the integral gain Ki so that the gain crossover frequency fc of the open loop transfer function which combined the transfer function of the integral control and the transfer function of the chopper circuit becomes smaller than the resonance frequency fo of the chopper circuit. See FIG. 10 and Operation A in FIG. 11.

According to this configuration, as mentioned above, since the transfer function P(s) of the chopper circuit can be approximated by the proportional element in the region where frequency is smaller than the resonance frequency f0, the integral gain Ki is set so that the gain crossover frequency fc is located in this region, and the integral control of feedback control functions at the gain crossover frequency fc. Therefore, at the gain crossover frequency fc, the gain inclination of the open loop transfer function Go(s) can be brought close to −20 dB/dec, and the phase can be brought close to −90 degrees. And, the feedback control system can be stabilized and the response can be secured.

The feedback control unit 32 calculates the gain of the proportional element in the transfer function P (s) of the chopper circuit, based on at least any two or more of the information on the output voltage Vout, the information on the input voltage Vin, and the information on duty ratio D; and changes the integral gain Ki according to a reciprocal of the gain of the proportional element, and a target value of gain crossover frequency fco of the open loop transfer function. Herein, the open loop transfer function is a transfer function which combined the transfer function of the integral control, and the transfer function of the chopper circuit. See FIG. 10 and Operation B in FIG. 11

In the present embodiment, the feedback control unit 32 changes the integral gain Ki, using the equation (7) and an equation (17) which is similar to the first equation of the equation (10). An equation in which one or both of the first equation and the second equation of the equation (14) are substituted for the equation (17) may be used. As shown in the first equation of the equation (17), the feedback control unit 32 changes the integral gain Ki, based on any two or more of the information on the output voltage Vout, the information on the input voltage Vin, and the information on duty ratio D, and the detection value ILd of reactor current. As shown in the second equation of the equation (17), since the term of RL×ILd can also be ignored as 0, the detection value ILd of reactor current may not be used.

$$K_i = \frac{2\pi f_{co}(1-D)^2}{V_{out}(1-D) - R_L I_{Ld}}, \text{ or } K_i = \frac{2\pi f_{co}(1-D)^2}{V_{out}(1-D)} \quad (17)$$

In the equation (17), Vout is the information on the output voltage, and D is the information on duty ratio; and these are set as explained using the equation (15). fco is the target value of gain crossover frequency. ILd is the detection value of reactor current. RL is a preliminarily set resistance value of the reactor 101, and a preliminarily set value is used. See FIG. 10 and Operation C in FIG. 12.

The feedback control unit 32 sets the target value of gain crossover frequency fco to a frequency smaller than the resonance frequency f0 of the chopper circuit calculated based on any two or more of the information on the output voltage Vout, the information on the input voltage Vin, and the information on duty ratio D.

The feedback control unit 32 calculates the resonance frequency f0 using the equation (18) similar to the equation (3). Herein, an equation in which one or both of the first equation and the second equation of the equation (14) are substituted for the equation (18) may be used. Then, for example, the feedback control unit 32 sets the target value of gain crossover frequency fco to a value obtained by multiplying a coefficient a which is set to a value smaller than 1 (for example, value less than or equal to 0.5) to the resonance frequency f0.

$$f_0 = \frac{1-D}{2\pi\sqrt{L \cdot C_{out}}} \quad (18)$$

$$f_{co} = \alpha \cdot f_0 (\alpha < 1)$$

The feedback control unit 32 upper-limits the target value of gain crossover frequency fco calculated according to the resonance frequency f0, by an upper limit frequency. The upper limit frequency is set to a frequency smaller than the switching frequency fsw. For example, the upper limit frequency is set to a frequency less than or equal to 1/10 to 1/20 of the switching frequency fsw.

As explained using FIG. 8A to FIG. 8D and the like, the feedback control unit 32 should just perform the integral control at least. For example, the feedback control unit 32 may perform the integral control so that the integral control functions at the gain crossover frequency fc. Alternatively, the feedback control unit 32 may perform the proportional integral control, the proportional integral differential control, or the integral differential control, in which each break frequency fip, fpd, fid is larger than the resonance frequency f0 as the equation (12).

According to this configuration, as mentioned above, since the transfer function P(s) of the chopper circuit can be approximated by the proportional element in the region where frequency is smaller than the resonance frequency f0, the integral gain Ki is set so that the gain crossover frequency fc is located in this region, and the integral control of feedback control functions at the gain crossover frequency fc. Therefore, at the gain crossover frequency fc, the gain inclination of the open loop transfer function Go(s) can be brought close to −20 dB/dec, and the phase can be brought close to −90 degrees. And, the feedback control system can be stabilized and the response can be secured.

<The case where the differential control is made function at the gain crossover frequency>

As shown in the equation (19), in the feedback control, the feedback control unit 32 performs at least the differential control which differentiates a value obtained by multiplying the differential gain Kd to the deviation ΔVout, and changes the feedback value of duty ratio Dfb. Herein, s of the right side expresses differentiation. See FIG. 10 and Operation E in FIG. 13.

$$D_{fb}(s) = \Delta V_{out} K_d s \ldots \quad (19)$$

The feedback control unit 32 changes the differential gain Kd based on at least any two or more of the information on the output voltage Vout, the information on the input voltage Vin, and the information on duty ratio D, so that the gain crossover frequency of the open loop transfer function which combined the transfer function of the differential control and the transfer function of the chopper circuit becomes larger than the resonance frequency f0 of the chopper circuit. See FIG. 10 and Operation E in FIG. 13.

According to this configuration, as mentioned above, since the transfer function P(s) of the chopper circuit can be approximated by the second order integral element in the region where frequency is larger than the resonance frequency f0, the differential gain Kd is set so that the gain crossover frequency fc is located in this region, and the differential control of feedback control functions at the gain crossover frequency fc. Therefore, at the gain crossover frequency fc, the gain inclination of the open loop transfer function Go(s) can be brought close to −20 dB/dec, and the phase can be brought close to −90 degrees. And, the feedback control system can be stabilized and the response can be secured.

The feedback control unit 32 calculates the gain of the second order integral element in the transfer function P (s) of the chopper circuit, based on at least any two or more of the information on the output voltage Vout, the information on the input voltage Vin, and the information on duty ratio D; and changes the differential gain Kd according to a reciprocal of the gain of the second order integral element, and a target value of gain crossover frequency fco of the open loop transfer function. Herein, the open loop transfer function is a transfer function which combined the transfer function of the differential control, and the transfer function of the chopper circuit. See FIG. 10 and Operation F in FIG. 13.

In the present embodiment, the feedback control unit 32 changes the differential gain Kd, using the equation (7) and an equation (20) which is similar to the second equation of the equation (10). An equation in which one or both of the first equation and the second equation of the equation (14) are substituted for the equation (20) may be used. As shown in the first equation of the equation (20), the feedback control unit 32 changes the differential gain Kd, based on any two or more of the information on the output voltage Vout, the information on the input voltage Vin, and the information on duty ratio D, and the detection value ILd of reactor current. As shown in the second equation of the equation (20), since the term of RL×ILd can also be ignored as 0, the detection value ILd of reactor current may not be used.

$$K_d = \frac{2\pi f_{co} L \cdot C_{out}}{V_{out}(1-D) - R_L I_{Ld}}, \text{ or } K_d = \frac{2\pi f_{co} L \cdot C_{out}}{V_{out}(1-D)} \quad (20)$$

In the equation (20), Vout is the information on the output voltage, and D is the information on duty ratio; and these are set as explained using the equation (15). fco is the target value of gain crossover frequency. Cout is the capacity of the output side smoothing capacitor 3, and a preliminarily set value is used. L is the inductance of the reactor 101, and a preliminarily set value is used. ILd is the detection value of reactor current. RL is the preliminarily set resistance value of the reactor 101, and a preliminarily set value is used. See FIG. 10 and Operation G in FIG. 14.

The feedback control unit 32 sets the target value of gain crossover frequency fco to a frequency larger than the resonance frequency f0 of the chopper circuit and smaller than the break frequency fvdz of the first order lead element of the chopper circuit. The feedback control unit 32 calculates the resonance frequency fO, based on any two or more of the information on the output voltage Vout, the information on the input voltage Vin, and the information on duty ratio D, as mentioned above. The feedback control unit 32 calculates the break frequency fvdz of the chopper circuit, based on any two or more of the information on the output voltage Vout, the information on the input voltage Vin, and the detection value Itd of reactor current. See FIG. 10 and Operation H in FIG. 14.

In the present embodiment, the feedback control unit 32 calculates the resonance frequency f0 using an equation (21) similar to the equation (3). An equation in which one or both of the first equation and the second equation of the equation (14) are substituted for the equation (21) may be used. The feedback control unit 32 calculates the break frequency fvdz using an equation (22) similar to the equation (4). An equation in which one or both of the first equation and the second equation of the equation (14) are substitutes for the equation (22) may be used. The term of RL×ILd may be ignored as 0 as the second equation of the equation (22).

$$f_0 = \frac{1-D}{2\pi\sqrt{L \cdot C_{out}}} \quad (21)$$

$$f_{vdz} = \frac{V_{out}(1-D) - R_L I_{Ld}}{2\pi L \cdot I_{Ld}}, \text{ or } f_{vdz} = \frac{V_{out}(1-D)}{2\pi L \cdot I_{Ld}} \quad (22)$$

Then, for example, as shown in an equation (23), the feedback control unit 32 sets the target value of gain crossover frequency fco to a frequency of ratio β between the resonance frequency f0 and the break frequency fvdz. The ratio β is set to a value between 0 and 1, for example, is set to 0.5.

$$f_{co} = \beta \cdot f_0 + (1-\beta) \cdot f_{vdz} \quad (23)$$

The feedback control unit 32 upper-limits the target value of gain crossover frequency calculated by the equation (21) and the equation (22), by an upper limit frequency. The upper limit frequency is set to a frequency smaller than the switching frequency fsw. For example, the upper limit frequency is set to a frequency less than or equal to 1/10 to 1/20 of the switching frequency fsw.

As explained using FIG. 9A to FIG. 9D and the like, the feedback control unit 32 should lust perform the differential control at least. For example, the feedback control unit 32 may perform the differential control so that the differential control functions at the gain crossover frequency fc. Alternatively, the feedback control unit 32 may perform the proportional differential control, the proportional integral differential control, or the integral differential control, in which each break frequency fpd, fip, fid is smaller than the resonance frequency f0 as the equation (13).

According to this configuration, as mentioned above, since the transfer function P(s) of the chopper circuit can be approximated by the second order integral element in the region where frequency is larger than the resonance frequency f0 and smaller than break frequency fvdz, the differential gain Kd is set so that the gain crossover frequency fc is located in this region, and the differential control of feedback control functions at the gain crossover frequency fc. Therefore, at the gain crossover frequency fc, the gain inclination of the open loop transfer function Go(s) can be brought close to −20 dB/dec, and the phase can be brought close to −90 degrees. And, the feedback control system can be stabilized and the response can be secured.

<Control Change According to the Resonance Frequency f0>

About all the resonance frequency f0 which changes according to the information on duty ratio D and the like, either one of the integral control and the differential control may function at the gain crossover frequency fc. However, it is considered to change the control which functions at the gain crossover frequency fc between the integral control and the differential control, according to change of the resonance frequency f0.

Then, for example, using the equation (18) or the equation (21), the feedback control unit 32 calculates the resonance frequency f0 of the chopper circuit, based on any two or more of the information on the output voltage Vout, the information on the input voltage Vin, and the information on duty ratio D. For example, using the equation (22), the feedback control unit 32 calculates the break frequency fvdz of the first order lead element of the chopper circuit, based on any two or more of the information on the output voltage Vout, the information on the input voltage Vin, and the information on duty ratio D, and the detection value ILd of reactor current.

Then, when the resonance frequency f0 is smaller than a determination frequency, the feedback control unit 32 changes control gain of the feedback control, so that the gain crossover frequency fc of the open loop transfer function which combined the transfer function of the feedback control and the transfer function of the chopper circuit becomes smaller than the resonance frequency fO, and exists in a frequency region where the integral control included in the feedback control functions. On the other hand, when the resonance frequency f0 is larger than the determination frequency, the feedback control unit 32 changes control gain of the feedback control, so that the gain crossover frequency fc of the open loop transfer function becomes larger than the resonance frequency f0 and smaller than the break frequency fvdz, and exists in a frequency region where the differential control included in the feedback control functions. See FIG. 10 and Operation I in FIG. 15.

According to this configuration, since the gain crossover frequency fc is made smaller than the resonance frequency f0 when the resonance frequency f0 is larger than the determination frequency, and the gain crossover frequency fc is made larger than the resonance frequency f0 when the resonance frequency f0 is smaller than the determination frequency, even if the resonance frequency f0 changes according to the duty ratio, the gain crossover frequency fc can be set to appropriate frequency, and the response of feedback control can be secured.

The feedback control includes at least the integral control and the differential control. For example, the feedback control is the integral differential control or the proportional integral differential control. Then, when the resonance frequency f0 is smaller than the determination frequency, the feedback control unit 32 sets the target value of gain crossover frequency fco to a frequency smaller than the resonance frequency f0, for example using the equation (18), and sets the integral gain Ki, for example using the equation (17). The feedback control unit 32 adjusts the proportional gain Kp and the differential gain Kd so that the break frequencies fid, fip, fpd of the integral differential control or the proportional integral differential control become larger than the resonance frequency f0 like the equation (12).

When the resonance frequency f0 is larger than the determination frequency, the feedback control unit 32 sets the target value of gain crossover frequency fco to a frequency larger than the resonance frequency f0 and smaller than the break frequency fvdz, for example using the equation (21) to the equation (23), and sets the differential gain Kd, for example using the equation (20). The feedback control unit 32 adjusts the proportional gain Kp and the integral gain Ki so that the break frequencies fid, fip, fpd of the integral differential control or the proportional integral differential control become smaller than the resonance frequency f0 like the equation (13).

<Change of the number of break frequencies according to the resonance frequency f0>

Further, it is considered to change the feedback control, according to change of the resonance frequency f0. For example, using the equation (18) or the equation (21), the feedback control unit 32 calculates the resonance frequency f0 of the chopper circuit, based on any two or more of the information on the output voltage Vout, the information on the input voltage Vin, and the information on duty ratio D. Then, the feedback control unit 32 changes the number of break frequencies of the transfer function of the feedback control, according to whether the resonance frequency f0 is smaller than or larger than the determination frequency. See FIG. 10 and Operation J in FIG. 15.

For example, when the resonance frequency f0 is smaller than the determination frequency, the feedback control unit 32 sets the feedback control to the integral control, and sets the number of break frequencies to 0. When the resonance frequency f0 is larger than the determination frequency, the feedback control unit 32 sets the feedback control to the integral differential control, the proportional integral differential control, or the proportional differential control, and sets the number of break frequencies to one or two. See FIG. 10 and Operation J in FIG. 15.

When the resonance frequency f0 is smaller than the determination frequency, the feedback control unit 32 sets the target value of gain crossover frequency fco to a frequency smaller than the resonance frequency f0, for example using the equation (18), and sets the integral gain Ki, for example using the equation (17). See FIG. 10 and Operation D in FIG. 12.

When the resonance frequency f0 is larger than the determination frequency, the feedback control unit 32 sets the target value of gain crossover frequency fco to a frequency larger than the resonance frequency f0 and smaller than the break frequency fvdz, for example using the equation (21) to the equation (23), and sets the differential gain Kd, for example using the equation (20). The feedback control unit 32 adjusts the proportional gain Kp and the integral gain Ki so that the break frequencies fid, fip, fpd of the integral differential control or the proportional integral differential control become smaller than the resonance frequency f0 like the equation (13).

Although the present disclosure is described above in terms of an exemplary embodiment, it should be understood that the various features, aspects and functionality described in the embodiment are not limited in their applicability to the particular embodiment with which they are described, but instead can be applied, alone or in various combinations to the embodiment. It is therefore understood that numerous modifications which have not been exemplified can be devised without departing front the scope of the present disclosure. For example, at least one of the constituent components may be modified, added, or eliminated.

What is claimed is:

1. A power converter comprising:
   a chopper circuit that converts direct current (DC) power between an input terminal and an output terminal, and comprises a reactor, a switching device, an input capacitor connected at an input terminal side of the reactor and connected between a positive electrode side and a negative electrode side of the input terminal, a diode connected to an output terminal side of the reactor and the switching device, and an output capacitor connected to the diode and the switching device and connected between a positive electrode side and a negative electrode side of the output terminal;
   a voltage detection circuit that detects an output voltage outputted from the output terminal; and
   a control circuit that performs feedback control which changes a feedback value of duty ratio so that a deviation between a target value of the output voltage and a detection value of the output voltage approaches to 0, and controls on/off of the switching device by the feedback value of duty ratio,
   wherein the control circuit changes a frequency characteristic of the feedback control, based on at least any two or more of information on the output voltage, information on an input voltage inputted into the input terminal, and information on duty ratio, and
   wherein the control circuit is a digital control circuit, and
   wherein in the feedback control, the control circuit performs at least integral control which integrates a value obtained by multiplying an integral gain to the deviation, and changes the feedback value of duty ratio; and
   changes the integral gain based on at least any two or more of the information on the output voltage, the information on the input voltage, and the information on duty ratio, so that a gain crossover frequency of an open loop transfer function which combines a transfer function of the integral control and a transfer function of the chopper circuit becomes smaller than a resonance frequency of the chopper circuit.

2. The power converter according to claim 1, wherein the control circuit is a digital control circuit, and
   wherein the control circuit uses, as the information on the output voltage, the detection value of the output voltage or the target value of the output voltage; uses, as the information on the input voltage, a detection value of the input voltage detected by the voltage detection circuit or a setting value of the input voltage; and uses, as the information on duty ratio, the feedback value of duty ratio or a calculation value of duty ratio calculated based on the information of the output voltage and the information of the input voltage.

3. The power converter according to claim 1,
wherein the control circuit
calculates a gain of a proportional element in a transfer function of the chopper circuit representing change of the output voltage with respect to change of the duty ratio, based on at least any two or more of the information on the output voltage, the information on the input voltage, and the information on duty ratio; and
changes the integral gain according to a reciprocal of the gain of the proportional element, and a target value of a gain crossover frequency of an open loop transfer function which combined a transfer function of the integral control and a transfer function of the chopper circuit.

4. The power converter according to claim 3, wherein the control circuit is a digital control circuit, and
wherein the control circuit sets the target value of the gain crossover frequency to a frequency smaller than a resonance frequency of the chopper circuit which is calculated based on any two or more of the information on the output voltage, the information on the input voltage, and the information on duty ratio.

5. The power converter according to claim 1,
wherein the power converter further comprises a current detection circuit that detects a current flowing through the reactor,
wherein the control circuit
by setting the information on the output voltage to Vout, setting a detection value of the current to ILd, setting a resistance value of the reactor to RL, setting the information on duty ratio to D, setting a target value of a gain crossover frequency of an open loop transfer function which combined a transfer function of the integral control and a transfer function of the chopper circuit to fco, and setting the integral gain to Ki, changes the integral gain by a calculation equation of $$Ki=2\pi \times fco \times (1-D)^2/(Vout \times (1-D)-RL \times ILd)$$

or $$Ki=2\pi \times fco \times (1-D)^2/(Vout \times (1-D)).$$

6. A power converter comprising:
a chopper circuit that converts direct current (DC) power between an input terminal and an output terminal, and comprises a reactor, a switching device, an input capacitor connected at an input terminal side of the reactor and connected between a positive electrode side and a negative electrode side of the input terminal, a diode connected to an output terminal side of the reactor and the switching device, and an output capacitor connected to the diode and the switching device and connected between a positive electrode side and a negative electrode side of the output terminal;
a voltage detection circuit that detects an output voltage outputted from the output terminal; and
a control circuit that performs feedback control which changes a feedback value of duty ratio so that a deviation between a target value of the output voltage and a detection value of the output voltage approaches to 0, and controls on/off of the switching device by the feedback value of duty ratio,
wherein the control circuit changes a frequency characteristic of the feedback control, based on at least any two or more of information on the output voltage, information on an input voltage inputted into the input terminal, and information on duty ratio, and wherein the control circuit is a digital control circuit, and
wherein in the feedback control, the control circuit performs at least differential control which differentiates a value obtained by multiplying a differential gain to the deviation, and changes the feedback value of duty ratio; and
changes a differential gain based on at least any two or more of the information on the output voltage, the information on the input voltage, and the information on duty ratio, so that a gain crossover frequency of an open loop transfer function which combines a transfer function of the differential control and a transfer function of the chopper circuit becomes larger than a resonance frequency of the chopper circuit.

7. The power converter according to claim 6,
wherein the power converter further comprises a current detection circuit that detects a current flowing through the reactor,
wherein the chopper circuit is provided with a smoothing capacitor just before the output terminal,
wherein the control circuit
by setting the information on the output voltage to Vout, setting a detection value of the current to ILd, setting a resistance value of the reactor to RL, setting an inductance of the reactor to L, setting the information on duty ratio to D, setting a capacity of the smoothing capacitor to Cout, setting a target value of a gain crossover frequency of an open loop transfer function which combines a transfer function of the differential control and a transfer function of the chopper circuit to fco, and setting the differential gain to Kd, changes the differential gain by a calculation equation of $$Kd=2\pi \times fco \times L \times Cout/(Vout \times (1-D)-RL \times ILd)$$

or $$Kd=2\pi \times fco \times L \times Cout/(Vout \times (1-D)).$$

8. The power converter according to claim 6,
wherein the control circuit
calculates a gain of a second order integral element in a transfer function of the chopper circuit representing change of the output voltage with respect to change of the duty ratio, based on at least any two or more of the information on the output voltage, the information on the input voltage, and the information on duty ratio; and
changes the differential gain according to a reciprocal of the gain of the second order integral element, and a target value of a gain crossover frequency of an open loop transfer function which combines a transfer function of the differential control and a transfer function of the chopper circuit.

9. The power converter according to claim 8, wherein the control circuit is a digital control circuit, and
wherein the power converter further comprises a current detection circuit that detects a current flowing through the reactor,
wherein the control circuit calculates a resonance frequency of the chopper circuit based on any two or more of the information on the output voltage, the information on the input voltage, and the information on duty ratio;

calculates a break frequency of the chopper circuit based on any two or more of the information on the output voltage, the information on the input voltage, and the information on duty ratio, and a detection value of the current; and sets a target value of the gain crossover frequency to a frequency larger than the resonance frequency of the chopper circuit and smaller than the break frequency of the chopper circuit.

10. A power converter comprising:

a chopper circuit that converts direct current (DC) power between an input terminal and an output terminal, and comprises a reactor, a switching device, an input capacitor connected at an input terminal side of the reactor and connected between a positive electrode side and a negative electrode side of the input terminal, a diode connected to an output terminal side of the reactor and the switching device, and an output capacitor connected to the diode and the switching device and connected between a positive electrode side and a negative electrode side of the output terminal;

a voltage detection circuit that detects an output voltage outputted from the output terminal; and a control circuit that performs feedback control which changes a feedback value of duty ratio so that a deviation between a target value of the output voltage and a detection value of the output voltage approaches to 0, and controls on/off of the switching device by the feedback value of duty ratio, wherein the control circuit changes a frequency characteristic of the feedback control, based on at least any two or more of information on the output voltage, information on an input voltage inputted into the input terminal, and information on duty ratio, and wherein the control circuit is a digital control circuit, and wherein the power converter further comprises a current detection circuit that detects a current flowing through the reactor, wherein the control circuit calculates a resonance frequency of the chopper circuit based on any two or more of the information on the output voltage, the information on the input voltage, and the information on duty ratio;

calculates a break frequency of the chopper circuit based on any two or more of the information on the output voltage, the information on the input voltage, and the information on duty ratio, and a detection value of the current; and when the resonance frequency is smaller than a determination frequency, changes control gain of the feedback control, so that a gain crossover frequency of an open loop transfer function which combines a transfer function of the feedback control and a transfer function of the chopper circuit becomes smaller than the resonance frequency, and exists in a frequency region where integral control included in the feedback control functions; and when the resonance frequency is larger than the determination frequency, changes control gain of the feedback control, so that the gain crossover frequency of the open loop transfer function becomes larger than the resonance frequency and smaller than the break frequency, and exists in a frequency region where differential control included in the feedback control functions.

11. The power converter according to claim 10, wherein the control circuit is a digital control circuit, and wherein the control circuit calculates the resonance frequency of the chopper circuit, based on any two or more of the information on the output voltage, the information on the input voltage, and the information on duty ratio; and changes number of break frequencies of a transfer function of the feedback control, according to whether the resonance frequency is smaller than or larger than the determination frequency.

\* \* \* \* \*